United States Patent [19]
Yamakawa

[11] Patent Number: 5,506,795
[45] Date of Patent: Apr. 9, 1996

[54] APPARATUS AND METHOD FOR GENERATING CHAOTIC SIGNALS AND CHAOS DEVICE

[76] Inventor: Takeshi Yamakawa, 781-300, Ohaza Koubukuro, Iizuka-shi, Fukuoka, Japan

[21] Appl. No.: 19,134

[22] Filed: Feb. 18, 1993

[30] Foreign Application Priority Data

Feb. 21, 1992 [JP] Japan .................................. 4-035042

[51] Int. Cl.$^6$ ........................................................ H04L 9/04
[52] U.S. Cl. ..................... 364/717; 364/524; 364/514 R; 364/808; 380/46
[58] Field of Search ..................................... 364/524, 514, 364/709.05, 715.01, 717, 718, 801–802, 808; 307/1; 380/46; 331/78

[56] References Cited

U.S. PATENT DOCUMENTS

| | | | |
|---|---|---|---|
| 4,769,777 | 9/1988 | Bittle et al. ........................ | 364/717 |
| 5,007,087 | 4/1991 | Bernstein et al. . | |
| 5,045,713 | 9/1991 | Shima .................................. | 307/201 |
| 5,048,086 | 9/1991 | Bianco et al. ...................... | 364/200 |
| 5,291,555 | 3/1994 | Cuomo et al. ...................... | 380/6 |

FOREIGN PATENT DOCUMENTS

| | | |
|---|---|---|
| 0467239 | 1/1992 | European Pat. Off. . |
| 1147657 | 6/1989 | Japan . |
| 3241879 | 10/1991 | Japan . |
| 4868140 | 3/1992 | Japan . |
| 4221937 | 8/1992 | Japan . |
| 4260923 | 9/1992 | Japan . |

OTHER PUBLICATIONS

"Chaos-Basis and Application of Chaos Theory", Kazuyuki Aihara, 1990, Science Co., Ltd publisher.
"Mathematical Science", May 1989 No. 311, Science Co., Ltd. publisher.
"Computer Today", Jul. 1989, No. 32, Science Co., Ltd. publisher.
"Computer Today", Sep. 1989, No. 33, Science Co., Ltd. publisher.
Frank Leimer, et al., "Elektronische Chaosgeneratoren", Radio Fernsehen Elektronik, Berlin 36 (1987) 5, pp. 280–285.
Jose C. Principe, et al., "Chaotic Dynamics of Time–Delay Neural Networks", International Join Conference on Neural Networks, Jun. 1990, San Diego, pp. 403–409.
European Search Report, dated Jan. 6, 1995, Appl. No. 93102546.
Maruyama et al., "Chaos in an Auto Gain Controlled Oscillator Containing Time Delay", 1989, Transactions of the Inst. of Electronics, Information, and Communication Engineers vol. J72A No. 11.

*Primary Examiner*—Emanuel T. Voeltz
*Assistant Examiner*—Craig S. Miller
*Attorney, Agent, or Firm*—Loeb and Loeb

[57] ABSTRACT

In order to provide an apparatus and method generating chaotically behaving signals or data, a plurality of delay elements 10 to 14 are connected in series, and an output of the foremost delay element 10 is supplied to a nonlinear function element 30, while outputs of the other delay elements 11 to 14 are supplied to coefficient elements 41 to 44, respectively. The outputs of the nonlinear function element 30 and coefficient elements 41 to 44 are summed at an adding element 50, and the resultant sum is fedback to the foremost delay element 10. Initializing elements 20 to 24 release their respective initial values at one time to thereby initiate the operation. At an appropriate period of time Δt, the delay, nonlinear operation, coefficient multiplication, and addition are repeated.

10 Claims, 23 Drawing Sheets

APPARATUS AND METHOD FOR GENERATING CHAOTIC SIGNALS AND CHAOS DEVICE

BACKGROUND OF THE INVENTION

1. Field of the Invention

The present invention relates to a chaotic signal generator and a method of manufacturing the same, and a chaos device.

A concept of "signal" used in this specification is intended to cover an analog signal, a binary signal, binary digital data and the like.

2. Description of the Related Arts

In the fields of mathematics, physics, computer science, and others, theoretical and empirical research into chaos is beginning to get lively. A chaos theory may be said to be possibly applied to data processing, computer science such as cellular automata, atmospheric conditions (e.g., weather forecast), prediction of complicated natural phenomena such as earthquakes, and others. In actual fact, however, it is still in its infancy.

The following are documents concerning chaos.

"Chaos—Basis and Application of Chaos Theory" written and edited by Kazuyuki Aihara, 1990, and published by Science Co., Ltd.

"Mathematical Science" November 1981 (No. 221), and May 1989 (No. 221), Science Co., Ltd.

"Computer Today" July 1989 (No. 32), and September 1989, (No. 33), Science Co. Ltd.

SUMMARY OF THE INVENTION

The present invention provides an apparatus and a method for generating signals behaving chaotically with time which are necessary for theoretical and empirical research into chaos and applicable to display and the like.

A first aspect of the present invention is intended to provide a basic apparatus (or a chaos device) and a method for generating chaotic signals which includes a nonlinear function element and a linear function element.

A chaotic signal generator according to the first aspect of the invention comprises a plurality of delay means for delaying input signals in sequence by a predetermined period of time; a nonlinear function means for converting through a nonlinear function a signal derived from at least one of the delay means; a coefficient means for multiplying signals derived from the other delay means by a predetermined coefficient; an adding means for adding signals derived from the nonlinear function means and coefficient means; and an initializing means for conferring initial values on the delay means, or the nonlinear function means and the coefficient means, or the adding means at the time of initiation of operation; output of the adding means being fedback to the foremost one of the plurality of delay means.

This chaotic signal generator can be implemented by a hardware architecture or by a computer software.

A chaos device according to the first aspect of the invention which will be realized by a hardware circuit comprises a plurality of delay circuits for delaying input signals in sequence by an infinitesimal period of time; a nonlinear function circuit for converting through a nonlinear function a signal derived from at least one of the delay circuits; a coefficient circuit for multiplying signals derived from the other delay circuits by a predetermined coefficient; an adding circuit for adding signals derived from the nonlinear function circuit and the coefficient circuit; and an initializing circuit for conferring initial values on the delay circuits, or the nonlinear function circuit and the coefficient circuit, or the adding circuit at the time of initiation of operation; output of the adding circuit being fedback to the foremost one of the plurality of delay circuits.

A method of generating chaotic signals according to the first aspect of the invention comprises the steps of retaining a plurality of sequentially inputted signals in the order of receiving the signals; converting through a nonlinear function at least one of the retained signals; multiplying the other retained signals by a predetermined coefficient; adding the signal subjected to the nonlinear function conversion and the signals multiplied by predetermined coefficient; retaining the signal obtained by addition as a most recent signal and shifting the retained signals in sequence; and the series of processes being initiated by conferring initial values and being repeated, thereby obtaining chaotic signals.

A second aspect of the present invention is aimed at providing a more general apparatus (or a chaos device) and a method for generating chaotic signals (or chaos device) which includes a plurality of nonlinear function elements.

An chaotic signal generator according to the second aspect of the invention comprises a plurality of delay means for delaying input signals in sequence by a predetermined period of time; a plurality of nonlinear function means for converting signals derived from at least one of the delay means through their respective nonlinear functions; an adding means for adding signals derived from the plurality of nonlinear function means; and an initializing means for conferring initial values on the delay means or the nonlinear function means at the time of initiation of operation; output of the adding means being fedback to the foremost one of the plurality of delay means.

This chaotic signal generator can also be implemented by a hardware architecture or a programmed computer.

A chaos device according to the second aspect of the invention which will be in particular realized by hardware comprises a plurality of delay circuits for delaying input signals in sequence by an infinitesimal period of time; a plurality of nonlinear function circuits for converting signals derived from the delay circuits through their respective predetermined nonlinear functions; an adding circuit for adding signals derived from the plurality of nonlinear function circuits; and an initializing circuit for conferring initial values on the delay circuits or the nonlinear function circuits at the time of initiation of operation; output of the adding circuit being fedback to the foremost one of the plurality of delay circuits.

A method of generating chaotic signals according to the second aspect of the invention comprises the steps of retaining a plurality of sequentially inputted signals in the order of receiving the signals; converting the retained signals through their respective predetermined nonlinear functions; adding the signals subjected to the nonlinear function conversions; retaining a signal obtained by addition as a most recent signal and shifting the retained signals in sequence; and the series of processes being initiated by conferring initial values and being repeated, thereby obtaining chaotic signals.

A third aspect of the present invention is directed to provide a generalized apparatus and method for generating chaotic signals which includes a multi-variable nonlinear function element.

A chaotic signal generator according to the third aspect of the invention comprises a plurality of delay means each for delaying a plurality of input variable signals by a predetermined period of time; a plurality of nonlinear function means for receiving as their respective inputs at least one of the variable signals derived from the plurality of delay means and for converting the input variable signals through a one-variable or multi-variable nonlinear function into function signals; a plurality of initializing means each for conferring corresponding initial values of respective input variable signals; the function signals derived from the nonlinear function means being fedback to the delay means.

This chaotic signal generator can also be implemented by a hardware architecture or computer software.

A method of generating chaotic signals according to the third aspect of the invention comprises the steps of retaining separately a plurality of input variable signals; converting separately some of the retained plurality of variable signals through a plurality of different multi-variable nonlinear functions into function signals; retaining separately the plurality of function signals derived form the multi-variable nonlinear function conversion as new input variable signals; the series of processes being initiated by conferring initial values and being repeated, thereby obtaining a plurality of chaotic signals.

The present invention further provides a linear delay element for use in the chaotic signal generator or the chaos device according to the first aspect of the invention.

This linear delay element comprises a delay element for delaying an input signal by a predetermined period of time; a coefficient element for multiplying the signal derived from the delay element by a predetermined coefficient; and an initializing element for conferring an initial value on the delay element or the coefficient element.

The present invention further provides a nonlinear delay element for use in the chaotic signal generator or the chaos device according to the first and second aspects of the invention.

This nonlinear delay element comprises a delay element for delaying an input signal by a predetermined period of time; a nonlinear function element for converting the signal derived from the delay element through a nonlinear function; and an initializing element for conferring an initial value as an input signal of the delay element, or as input signal of the nonlinear function element, or output signal of the nonlinear function element.

A combination of such a linear delay element, nonlinear element and adding circuit may yield a chaotic signal generator or a chaos device according to the first and second aspects of the invention. These delay elements are particularly effective in integrating the chaos device.

The present invention further provides a generalized nonlinear delay element for use in the chaotic signal generator according to the third aspect of the invention.

This generalized nonlinear delay element comprises a delay element for delaying an input variable signal by a predetermined period of time; a multi-variable nonlinear function element for converting a variable signal derived from the delay element and an externally supplied variable signal through a multi-variable nonlinear function into a function signal; and an initializing element for conferring an initial value on the delay element or the multi-variable nonlinear function element.

A combination of a plurality of such generalized nonlinear delay elements may result in an easy construction of the chaotic signal generator according to the third aspect of the invention.

According to the chaotic signal generator (or the chaos device) and the method of the present invention, there can be obtained output signals chaotically behaving on the time axis. It is therefore possible to perform, for example, empirical research or verification of theory on how the chaotic output signals behave depending on the nonlinear function and its parameters and initial values. In particular, provided that the chaotic signal generator of the present invention is implemented by a hardware circuit, the chaotic signals will be obtained very quickly.

Further, the direct or indirect use of the chaotic output signals derived from the chaotic signal generator and the method of the present invention realizes a variety of displays. These displays are not only nonpredictive, but are also even attractive, and maintain viewing interest, which is different from mere noise.

Besides the foregoing the chaotic output signals obtained by the chaotic signal generator and method of the present invention are applicable to many cases such as occurrence of sound, production of pattern pictures, generation of colors, creation of natural indoor air flow (for example, control of electric fans or air conditioners), control of game machines, and control of water flow in a fountain or the like.

DESCRIPTION OF THE PREFERRED EMBODIMENTS

It is known that a trajectory or a locus described by a set of solutions of a difference equation (or a recurrence equation) including a nonlinear function presents a chaotic behavior under properly defined parameters and initial values.

As an illustration, a difference equation will now be considered in the simplest form.

$$xn+1 = f(xn) + axn-1 = f(xn) + ayn \quad \ldots \text{Expression 1}$$

$$yn+1 = xn \quad \ldots \text{Expression 2}$$

where $f(xn)$ is a nonlinear function represented, for example, as $bxn^2$. The coefficients a and b are referred to as parameters.

If initial values (x0, y0) (which are values for x and y, respectively, when n=0) are given to the equations 1 and 2, the solutions are uniquely determined.

The n generally represented on a time axis is incremented every finite time $\Delta t$ (in general, an infinitesimal time).

Therefore, a set of solutions (xn, yn) of the equations 1 and 2 can be expressed on XY orthogonal coordinates, and points (xn, yn) representing the solutions describes a trajectory or locus with the lapse of time.

According to how the n is increased, the set of solutions may converge or diverge or periodically oscillate or quite irregularly vary. The fourthly mentioned behavior of the solutions varying quite irregularly is generally called chaos. The manner of behavior of the solutions exclusively depends on the parameter a, a parameter (such as b, for example) specifying the non-linearity of the parameter a, and the initial values (x0, y0).

Figure 1:
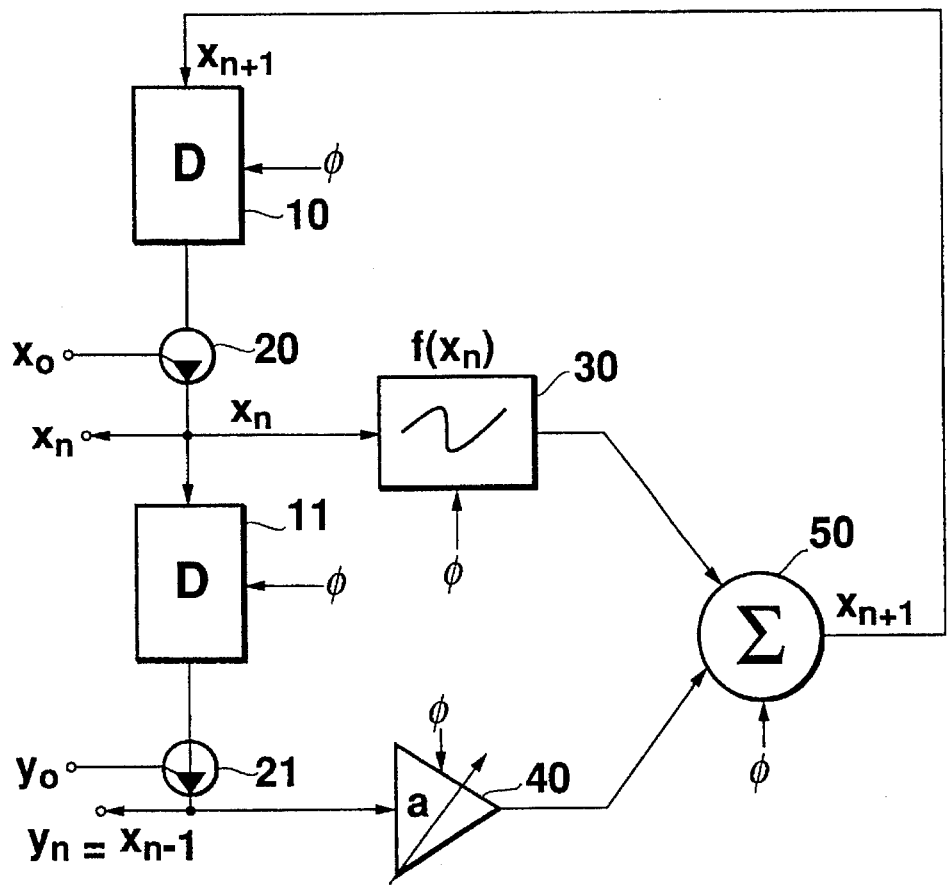
FIG. 1 shows a functional configuration of the simplest apparatus for generating chaotic signals which includes a nonlinear function element and a coefficient element.

FIG. 1 illustrates a functional configuration of a chaotic signal generator for solving the equations 1 and 2 and outputting a set of solutions with the lapse of time.

The chaotic signal generator comprises a couple of delay elements (e.g., delay circuits) 10 and 11, a couple of initializing elements (e.g., switching circuits for initialization) 20 and 21, a nonlinear function element (e.g., a nonlinear function circuit) 30, a coefficient element (e.g., a coefficient unit) 40, and an adding element (e.g., an adding circuit) 50. These elements receive a clock signal $\phi$ having a period of $\Delta t$ and act in synchronizm with the clock signal $\phi$.

The delay elements 10 and 11 produce an output signal which is delayed by one clock period $\Delta t$ with respect to the input signal.

Figure 2A:
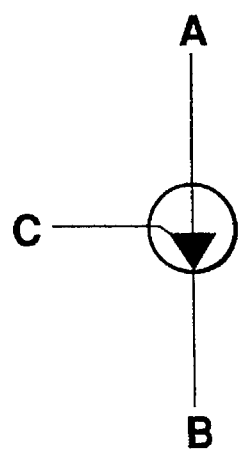
FIGS. 2A and 2B illustrate a symbol of an initializing element, and an embodied circuit thereof.
Figure 2B:
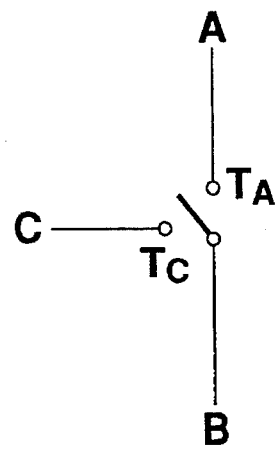

The initializing elements 20 and 21 each being represented by a symbol enlargedly illustrated in FIG. 2A are embodied in an electronic circuit as a change-over switch shown in FIG. 2B.

In order to set the initial value x0 or y0, the changeover switch is connected to a terminal TC, thereby permitting the initial value which is input into an input terminal C to be conducted to an output terminal B. Afterwards, the changeover switch is kept connected to a terminal TA, thereby allowing the input for an input terminal A to be transmitted to the output terminal B.

The nonlinear function element 30 is intended to produce a nonlinear function (xn) with respect to an input xn.

The coefficient element 40 generates an output obtained by multiplying an input yn by the coefficient a.

The adding element 50 finds the sum of all the inputs, and acts to output the result in the form of Xn+1.

The operation of the configuration shown in FIG. 1 is as follows.

When the initial values x0 and y0 are conferred through the initializing elements 20 and 21, respectively, the initial value x0 is supplied to the nonlinear function element 30 and the delay element 11, while the initial value y0 is supplied to the coefficient element 40. The nonlinear function element 30 and the coefficient element 40 output f(x0) and ay0, respectively. Further, the adding element 50 outputs x1=f(x0) +ay0 in accordance with Expression 1. The resultant x1 is input to the delay element 10.

After a lapse of one clock period $\Delta t$, the delay elements 10 and 11 output x1 and x0 (=y1), respectively.

In general, the delay elements 10 and 11 output xn and xn−1 (=yn), respectively, at any point in time. The nonlinear function element 30, coefficient element 40 and adding element 50 execute the operation shown as Expression 1. Then, xn+1 which represents the value of x at the next point in time is supplied from the adding element 50 to the delay element 10.

The outputs representing solutions xn and yn which may appear at the output terminals of the delay elements 10 and 11, respectively, are to be supplied externally in the form of the outputs of the initializing elements 20 and 21, respectively, whose change-over switches are connected to the respective terminals TA.

The functional configuration shown in FIG. 1 can be realized with the aid of an electronic circuit or a programmed computer as will be described later. In the case of using the electronic circuit, the change-over switch shown in FIG. 2B and various kinds of switches described hereinafter may preferably comprise semiconductor switching elements.

Reference will next be made to a generalized configuration.

Expression 3 represents a differential equation of higher order in the form of a recurrence equation.

$$xn+1 = f(xn) + a1xn-1 + a2xn-2 + a3xn-3 + a4xn-4 + \ldots + aiExpression\ 3$$

Expression 3 can be modified as follows.

$$xn+1 = f(xn) + a1yn + a2zn + a3pn + a4qn+ \quad \ldots \text{Expression 4}$$

$$yn+1 = xn \quad \ldots \text{Expression 5}$$

$$zn+1 = yn\ (=xn-1) \quad \ldots \text{Expression 6}$$

$$pn+1 = zn\ (=xn-2) \quad \ldots \text{Expression 7}$$

$$qn+1 = pn\ (=xn-3) \quad \ldots \text{Expression 8}$$

$f(xn)$ and $ai$ ($i=1, 2, 3, 4, \ldots$) represent a nonlinear function and a joint parameter, respectively.

Let a vector $Xn+1$ (note that a vector is denoted by a capital letter) be $$Xn+1 = \{xn+1, yn+1, zn+1, pn+1, qn+1, \ldots\}^T \quad \ldots \text{Expression 9}$$

Expression 4 through 8 can be expressed as $$Xn+1 = \begin{pmatrix} xn+1 \\ yn+1 \\ zn+1 \\ pn+1 \\ qn+1 \\ \vdots \end{pmatrix} = \begin{pmatrix} f(xn) \\ 0 \\ 0 \\ 0 \\ 0 \\ \vdots \end{pmatrix} + \begin{pmatrix} 0 & a1 & a2 & a3 & a4 & \ldots \\ 1 & 0 & 0 & 0 & 0 & \ldots \\ 0 & 1 & 0 & 0 & 0 & \ldots \\ 0 & 0 & 1 & 0 & 0 & \ldots \\ 0 & 0 & 0 & 1 & 0 & \ldots \\ \vdots & & & & & \end{pmatrix} \begin{pmatrix} xn \\ yn \\ zn \\ pn \\ qn \\ \vdots \end{pmatrix} \quad \text{Expression 10}$$

Here, $$F(xn) = \{f(xn), 0, 0, 0, 0 \ldots\}^T \quad \text{Expression 11}$$

$$A = \begin{pmatrix} 0 & a1 & a2 & a3 & a4 & \ldots \\ 1 & 0 & 0 & 0 & 0 & \ldots \\ 0 & 1 & 0 & 0 & 0 & \ldots \\ 0 & 0 & 1 & 0 & 0 & \ldots \\ 0 & 0 & 0 & 1 & 0 & \ldots \\ \vdots & & & & & \end{pmatrix} \quad \text{Expression 12}$$

Let $$Xn = \{xn, yn, zn, pn, qn, \ldots\}^T \quad \text{Expression 13,}$$

then, Expression 10 can be expressed in a simpler form as $$Xn+1 = F(xn) + A \cdot Xn \quad \ldots \text{Expression 14}$$

Figure 3:
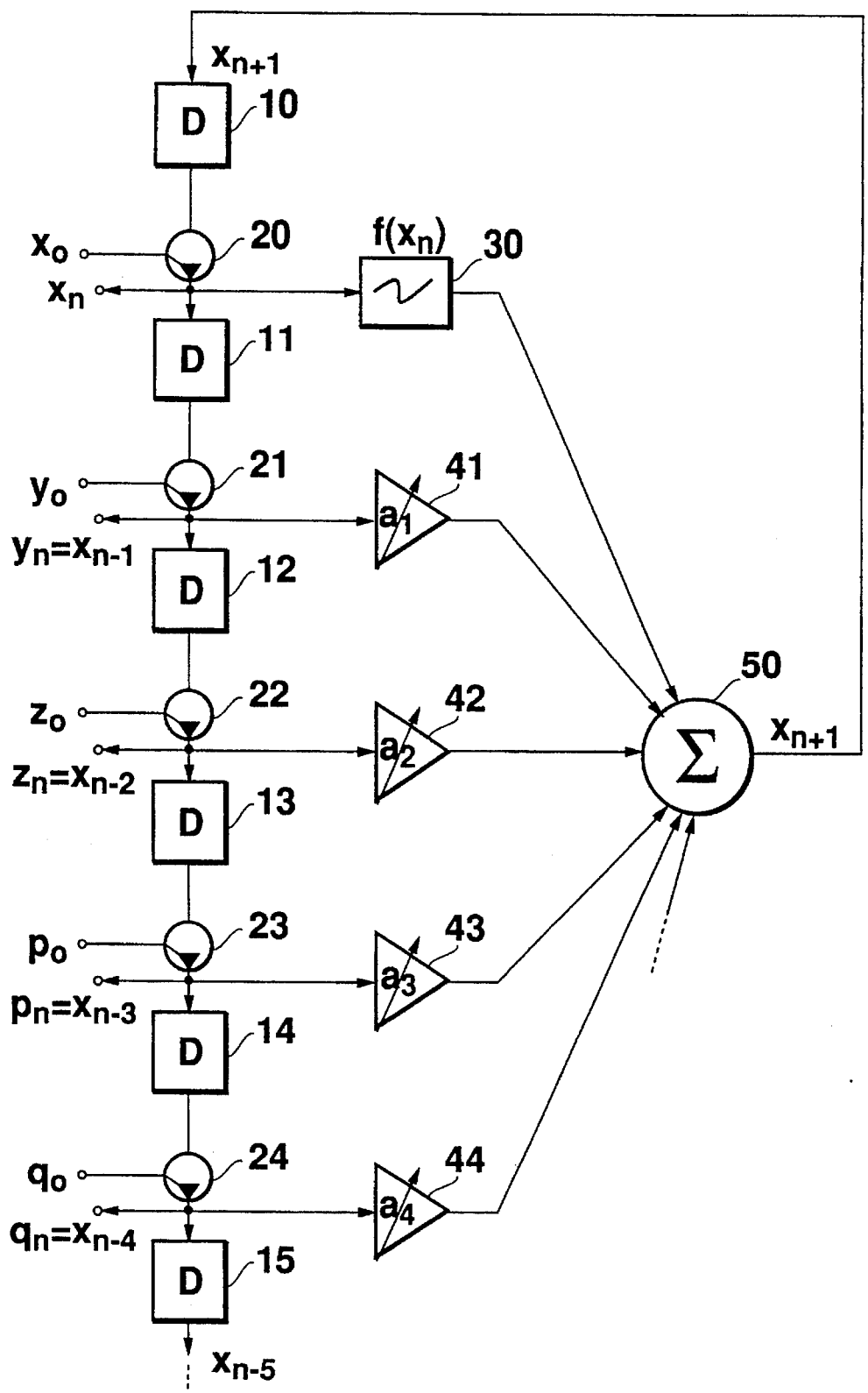
FIG. 3 represents a functional configuration of an apparatus for generating chaotic signals which includes a nonlinear function element and a plurality of coefficient elements.

FIG. 3 illustrates a functional configuration of a chaotic signal generator designed to find a solution $Xn = [xn, yn, zn, pn, qn, \ldots]^T$ (Expression 13) of the recurrence equation expressed as Expression 3, or Expressions 4 through 8, or Expression 10, or Expression 14.

The functional configuration comprises multiple delay elements 10, 11, 12, 13, 14, ..., initializing elements 20, 21, 22, 23, 24, ..., each intervening between the delay elements, a nonlinear function element 30 receiving an output from the initializing element 20, coefficient elements 41, 42 43, 44, ..., respectively, for multiplying outputs from the remaining initializing elements 21, 22, 23, 24, ... by coefficients a1, a2, a3 a4, ..., respectively, an adding element 50 for summing up outputs from the nonlinear function element 30 and the coefficient elements 41, 42, 43, 44, ... An output of the adding element 50 is fed back to the forefront delay element 10.

When the initial values $X0 = \{x0, y0, z0, p0, q0, \ldots\}^T$ are conferred through the respective initializing elements 20, 21, 22, 23, 24, respectively, the nonlinear function element 30 and the coefficient elements 41, 42, 43, 44, ... produce outputs $f(x0)$, a1y0, a2z0, a3p0, a4q0, ..., respectively, which are in turn summed up by the adding element 50 to obtain an output x1. The output x1 is fed back to the delay element 10.

At any point in time, the nonlinear function element 30 and the coefficient elements 41, 42, 43, 44, ... are allowed to receive xn, yn=xn-1, zn=xn-2, pn=xn-3, qn=xn-4, respectively, and produce outputs $f(xn)$, a1yn, a2zn, a3pn, a4qn, ..., respectively. As a result, the adding element 50 produces an output xn+1 expressed as Expression 4 which is in turn fed back to the forefront delay element 10.

Naturally, the above-described operation is carried out while incrementing n every one period $\Delta t$ of a clock signal $\phi$ not shown in FIG. 3.

A set of solutions $Xn = \{xn, yn, zn, pn, qn, \ldots\}^T$ which may appear at the outputs of the delay elements 10, 11, 12, 13, 14, ..., respectively, are to be supplied externally in terms of the outputs from the initializing elements 20, 21, 22, 23, 24, ... each having the change-over switch being connected to the terminal TA.

In place of conferring the set of initial values $X0 = \{x0, y0, z0, p0, q0, \ldots\}^T$ through the corresponding initializing elements, there may be input x0, x1, x2, x3, x4, ... (or, ..., x-4, x-3 x-2, x-1, x0) in sequence every one clock period by way of the delay element 10 or the initializing element 20. In this instance, the output of the adding element 50 is not permitted to be fed back to the delay element 10 until the input of all the initial values has been completed.

In FIGS. 1 and 3, the coefficients a, a1, a2, a3, a4, ... of the coefficient elements 40, 41 42, 43, 44, ..., respectively, are preferably externally changeable. Further, a nonlinear function to be provided within the nonlinear function element 30 is also preferably externally changeable in configuration.

A more generalized recurrence equation having a plurality of nonlinear functions will next be examined.

$$xn+1 = f0\ (xn) + f1(xn-1) + f2(xn-2) + f3(xn-3) + f4(xn-4) + \text{Expression 15}$$

Expression 15 can be modified as follows.

$$xn+1 = f0(xn) + yn + zn + pn + qn+ \quad \ldots \text{Expression 16}$$

$$yn = f1\ (xn-1) \quad \ldots \text{Expression 17}$$

$$zn = f2\ (xn-2) \quad \ldots \text{Expression 18}$$

$$pn = f3\ (xn-3) \quad \ldots \text{Expression 19}$$

$$q_n = f_4(x_{n-4}) \quad \ldots \text{Expression 20}$$

Figure 4:
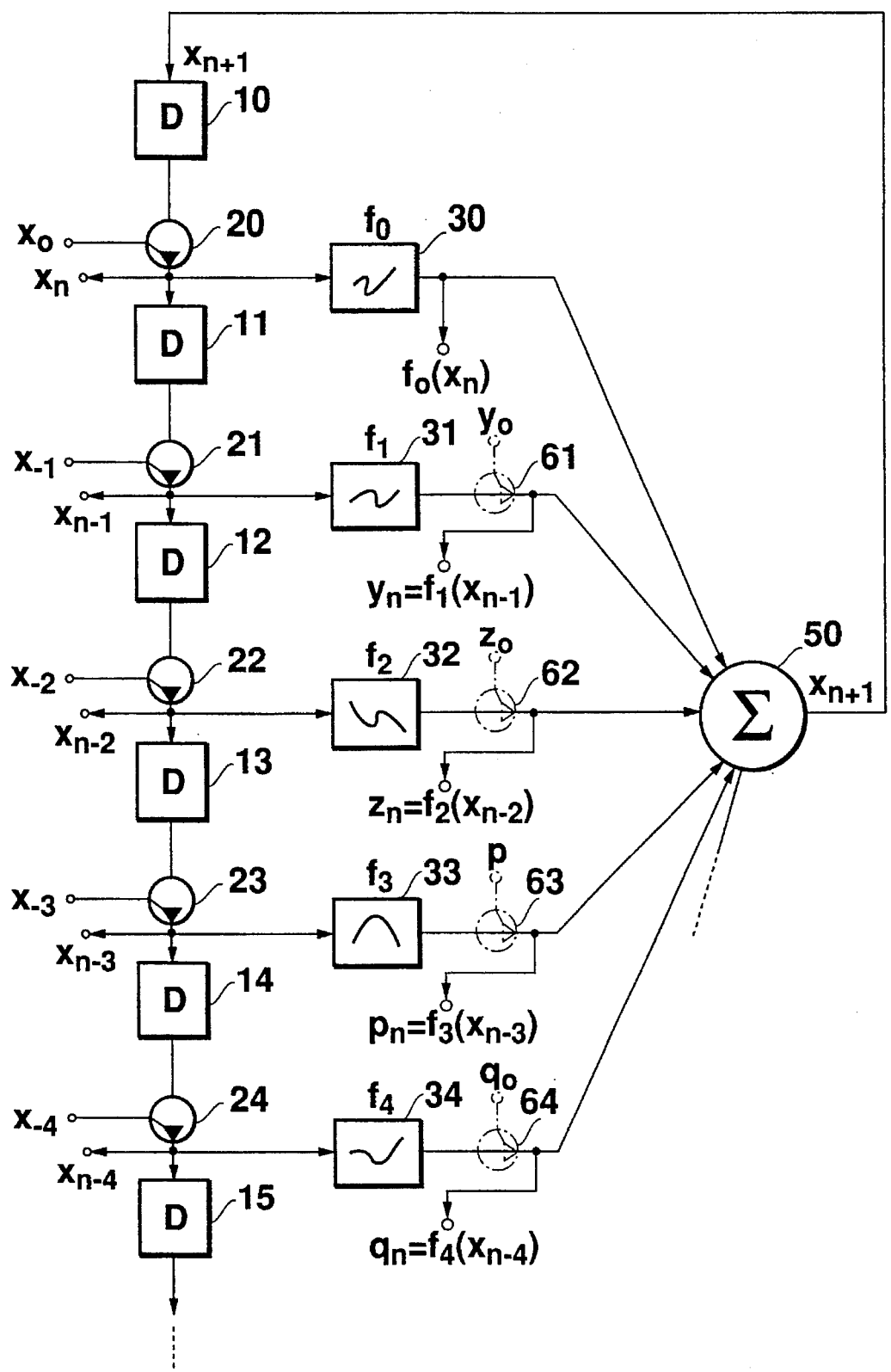
FIG. 4 depicts a functional configuration of a general apparatus for generating chaotic signals which includes a plurality of nonlinear function elements.

FIG. 4 illustrates a functional configuration of the chaotic signal generator adapted to find a solution $x_n$, or a set of solutions $x_n$, $x_{n-1}$, $x_{n-2}$, $x_{n-3}$, $x_{n-4}$, or $x_n$, $y_n$, $z_n$, $p_n$, $q_n$, . . . with respect to the recurrence equations denoted by Expressions 16 through 20.

The functional configuration comprises multiple delay elements 10, 11, 12, 13, 14, . . . , initializing elements 20, 21, 22, 23, 24, . . . each being interposed between the corresponding delay elements, nonlinear function elements 30, 31, 32, 33, 34, . . . which recieve outputs from the corresponding initializing elements 20, 21, 22, 23, 24, . . . , and an adding element 50 which sums up outputs from the nonlinear function elements 30, 31, 32, 33, 34, . . . . An output $x_{n+1}$ of the adding element 50 is fed back to the foremost delay element 10. The nonlinear function elements 30, 31, 32, 33, 34, . . . are provided with nonlinear functions $f_0, f_1, f_2, f_3, f_4$. . . , respectively.

Upon impartment of initial values $x_0$, $x_{-1}$, $x_{-3}$, $x_{-4}$, . . . through the initializing elements 20, 21, 22, 23, 24, . . . , the nonlinear function elements 30, 31, 32, 33, 34, . . . produce outputs $f_0(x_0)$, $y_0 = f_1(x_{-1})$, $z_0 = f_2(x_{-2})$, $p_0 = f_3(x_{-3})$, $q_0 = f_4(x_{-4})$, . . . which are in turn summed up with the aid of the adding element 50 to obtain an output $x_1$. The output $x_1$ is then fed back to the delay element 10.

At any point in time, the nonlinear function elements 30, 31, 32, 33, 34, . . . receive outputs $x_n$, $x_{n-1}$, $x_{n-2}$, $x_{n-3}$, $x_{n-4}$, respectively, and generate outputs $f_0(x_n)$, $y_n = f_1(x_{n-1})$, $z_n = f_2(x_{n-2})$, $p_n = f_3(x_{n-3})$, $q_n = f_4(x_{n-4})$, . . . respectively. As a result, the adding element 50 produces an output $x_{n+1}$ represented by Expression 15 or 16 which is in turn fed back to the delay element 10.

Naturally, the above-described operation is carried out while incrementing n every one period $\Delta t$ of the clock signal $\phi$ also not shown in FIG. 4.

The outputs $x_n$, $x_{n-1}$, $x_{n-2}$, $x_{n-3}$, $x_{n-4}$, . . . which may appear at the outputs of the delay elements 10, 11, 12, 13, 14, . . . are to be supplied externally in the form of the outputs of the initializing elements 20, 21, 22, 23, 24, . . . whose change-over switches are each connected to the respective terminals TA.

As described earlier, the outputs $f_0(x_n)$, $y_n = f_1(x_{n-1})$, $z_n = f_2(x_{n-2})$, $p_n = f_3(x_{n-3})$, $q_n = f_4(x_{n-4})$ can be derived from the nonlinear function elements 30, 31, 32, 33, 34, . . . , respectively.

In place of the initializing elements 21, 22, 23, 24, . . . , initial values $y_0 = f_1(x_{-1})$, $z_0 = f_2(x_{-2})$, $p_0 = f_3(x_{-3})$, $q_0 = f_4(x_{-4})$. . . may be input through initializing elements 61, 62, 63, 64, . . . , respectively, to the output of the nonlinear function elements 31, 32, 33, 34, . . . (and the corresponding input of the adding element 50) as indicated by a chain line.

Also in FIG. 4, the nonlinear functions to be set in the nonlinear function elements 30, 31, 32, 33, 34, . . . are preferably changeable.

Figure 5:
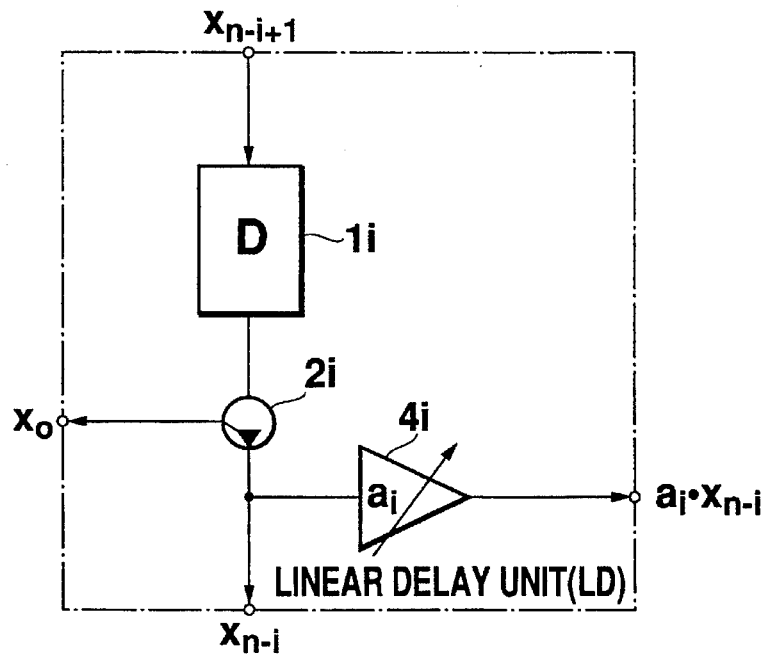
FIG. 5 is a block diagram showing a circuitry of a linear delay unit.
Figure 6:
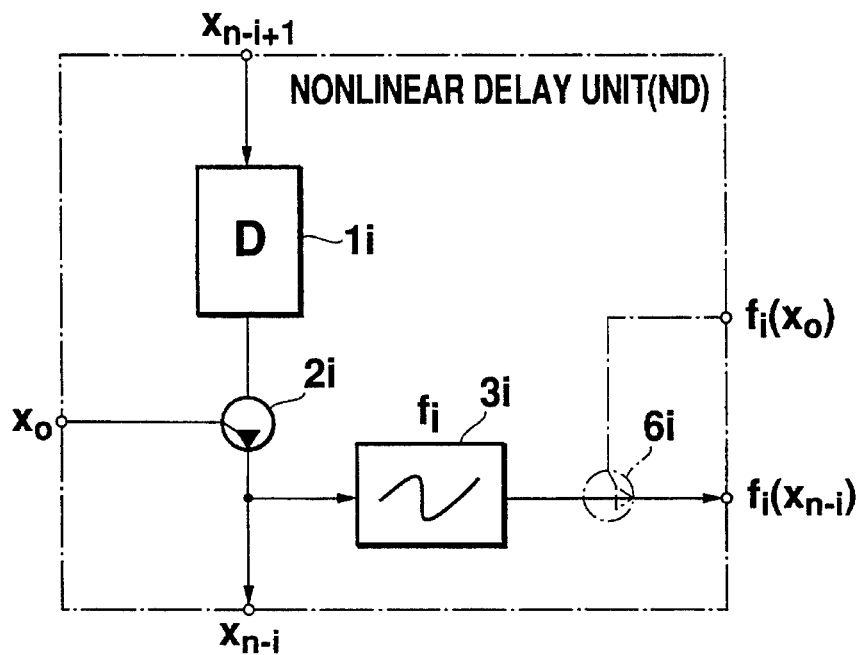
FIG. 6 is a block diagram showing a circuitry of a nonlinear delay unit.

The configuration shown in FIG. 3 may be supposedly dissolved into several units on the electronic circuit. FIGS. 5 and 6 each illustrates a unit which is an elementary functional constituent of the configuration shown in FIG. 3. A circuit illustrated in FIG. 5 is called a linear delay unit (LD). The linear delay unit (LD) includes a delay element $l_i$, an initializing element $2_i$ and a coefficient element $4_i$ (i = 1, 2, 3, 4, . . . ), the initializing element $2_i$ being connected to the output of the delay element $l_i$, and the coefficient element $4_i$ being connected to the output of the initializing element $2_i$. The linear delay unit (LD) further includes an input terminal through which an input $x_{n-i+1}$ enters the delay element $l_i$, an output terminal for supplying an output $x_{n-i}$ of the delay element $l_i$ via the initializing element $2_i$, an input terminal for the entry of an initial value $x_0$ (or $y_0$, $z_0$, $p_0$, $q_0$, . . . ), and a decorative output terminal for the departure of an output $a_i.x_{n-i}$ of the coefficient element $4_i$.

A circuit shown in FIG. 6 is called a nonlinear delay unit (ND). The nonlinear delay unit (ND) includes a delay element $l_i$, an initializing element $2_i$, and a nonlinear function element $3_i$ (i=0, 1, 2, 3, 4, . . . ), the initializing element $2_i$ being connected to the output of the delay element $l_i$, and the nonlinear element $3_i$ being connected to the output of the initializing element $2_i$. The nonlinear unit (ND) further includes an input terminal for the entry of an input $x_{n-i+1}$ to the delay element $l_i$, an output terminal for the departure of an output $x_{n-i}$ of the delay element $l_i$ by way of the initializing element $2_i$, a decorative output terminal for the departure of an output $f_i(x_{n-i})$ of the nonlinear function element $3_i$, and an input terminal for the entry of an initial value $x_0$ (or $x_{-1}$, $x_{-2}$, $x_{-3}$, $x_{-4}$, . . . ).

If necessary, an initializing element $6_i$ (i=1, 2, 3, 4, . . . ) as indicated by a chain line in addition to an input terminal for receiving an initial value $f_i(x_0)$ may be provided on the side of the output of the nonlinear function element $3_i$.

The output of one nonlinear delay unit (ND) is cascaded to the inputs of a plurality linear delay units (LD), and the terminals for the outputs $f_i(x_{n-i})$ and $a_i.x_{n-i}$ of the units (ND) and (LD) are connected to the input of the adding element 50. Finally, the output of the adding element 50 is fed back to the nonlinear delay unit (ND) for establishing the circuit shown in FIG. 3.

Figure 7:
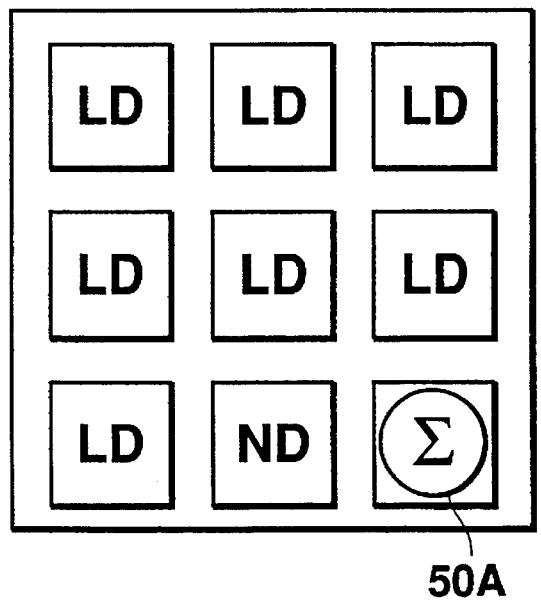
FIG. 7 shows a layout of an integrated chaos device.

Such a nonlinear delay unit (ND), a plurality of linear delay units (LD), and an adding unit 50A including the adding element 50 can be integrated on one chip. FIG. 7 schematically illustrates a chip layout of a thus integrated chaos device. This layout omits a wiring pattern for joining one unit to another. The adding unit 50A may comprise an operational amplifier and an input resistor array associated therewith.

In a similar manner, a plurality of nonlinear delay units (ND) are arranged in a cascade, and the terminal for the output $f_i(x_{n-i})$ of each unit (ND) is connected to the adding element 50. Finally, the output of the adding element 50 is fed back to the foremost nonlinear delay unit (ND), thereby establishing the circuit as shown in FIG. 4.

Figure 8:
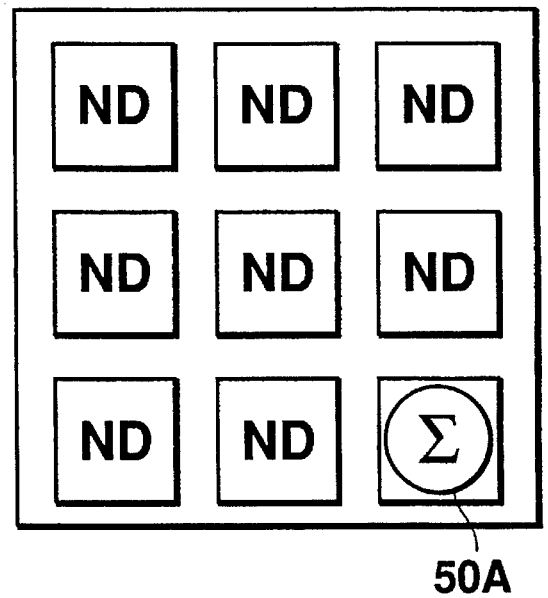
FIG. 8 illustrates a layout of another integrated chaos device.

It is possible to integrate on one chip such a plurality of nonlinear delay units (ND) and the adding unit 50A including the adding element 50. FIG. 8 diagramatically illustrates a chip layout of thus integrated chaos device. This layout also leaves out a wiring pattern for coupling one unit to another.

Generalized recurrence equations are expressed as follows.

$$x_{n+1} = f_1(x_n, y_n, z_n, p_n, q_n, \ldots) \quad \ldots \text{Expression 21}$$

$$y_{n+1} = f_2(x_n, y_n, z_n, p_n, q_n, \ldots) \quad \ldots \text{Expression 22}$$

$$z_{n+1} = f_3(x_n, y_n, z_n, p_n, q_n, \ldots) \quad \ldots \text{Expression 23}$$

$$p_{n+1} = f_4(x_n, y_n, z_n, p_n, q_n, \ldots) \quad \ldots \text{Expression 24}$$

$$q_{n+1} = f_5(x_n, y_n, z_n, p_n, q_n, \ldots) \quad \ldots \text{Expression 25}$$

$f_1, f_2, f_3, f_4, f_5, \ldots$ denote multivariate nonlinear functions.

Figure 9:
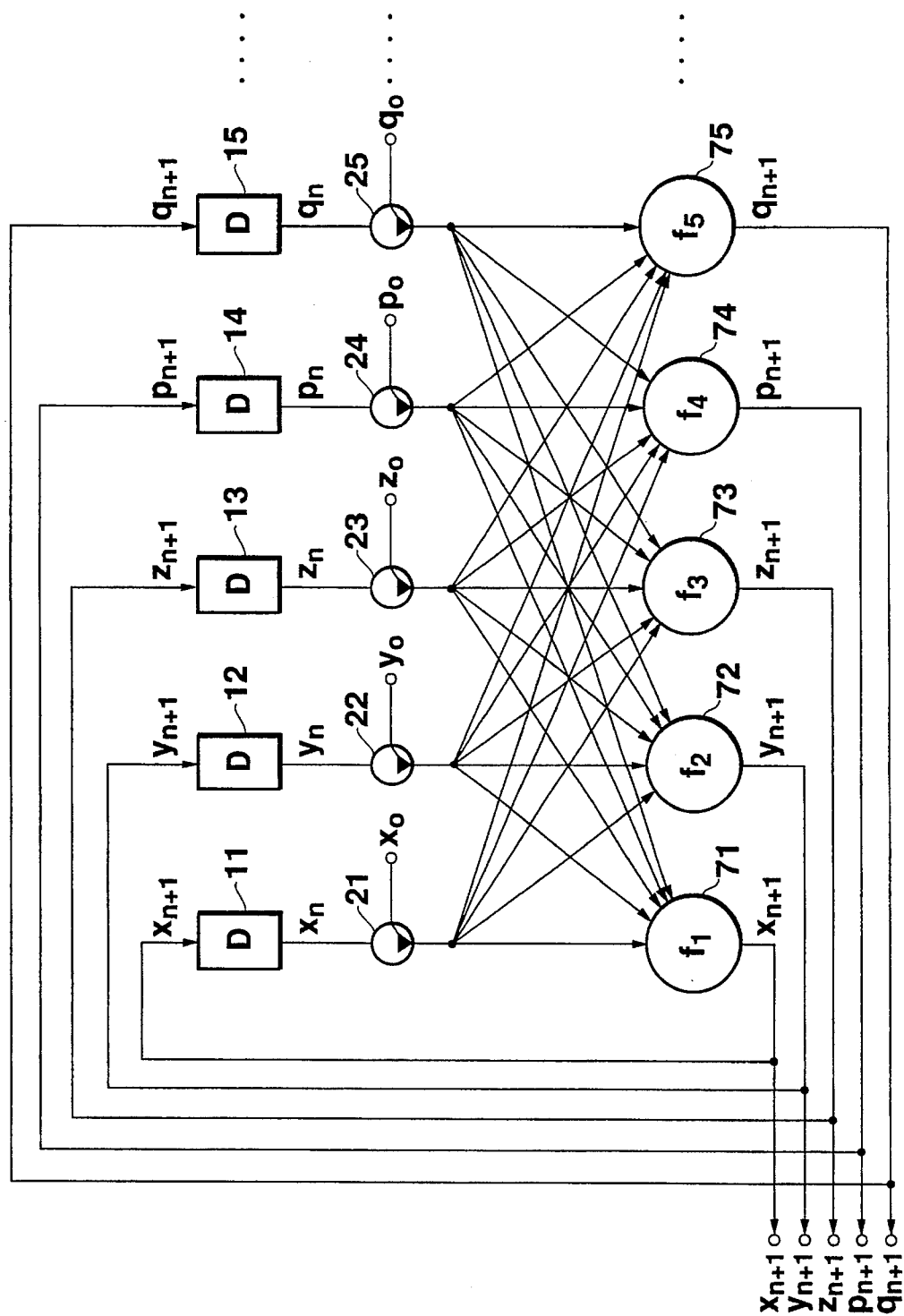
FIG. 9 represents a functional configuration of a general apparatus for generating chaotic signals which includes a plurality of multi-variable nonlinear function elements.

FIG. 9 illustrates a functional configuration of the chaotic signal generator which produces a series of solutions of the recurrence equations represented by Expressions 21 through 25. Expressions 21 through 25 are associated in tandem with delay elements 11 through 15, initializing elements 21 through 25, and multivariate nonlinear function elements 71 through 75, respectively. The multivariate nonlinear function elements 71 through 75 are to be supplied with outputs from all the initializing elements 21 through 25. Outputs $x_{n+1}$ through $q_{n+1}$ of the multivariate nonlinear function elements are supplied externally and are fed back to the corresponding delay elements 11 through 15. Each of the multivariate nonlinear function elements is not necessarily fed with the outputs from all of the initializing elements. A hop field model is a particular case using a weighted addition and a threshold function as the multivariate nonlinear function.

Figure 10:
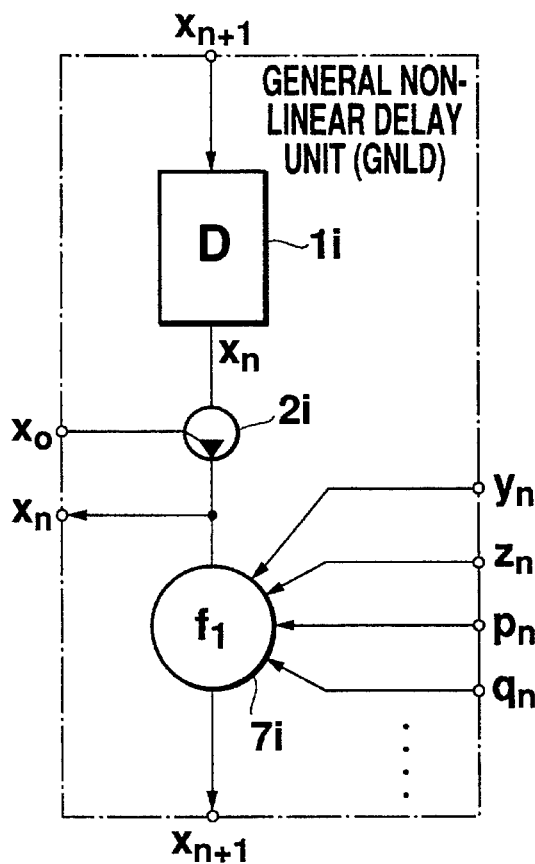
FIG. 10 is a block diagram showing a circuitry of a generalized nonlinear delay unit.
Figure 11:
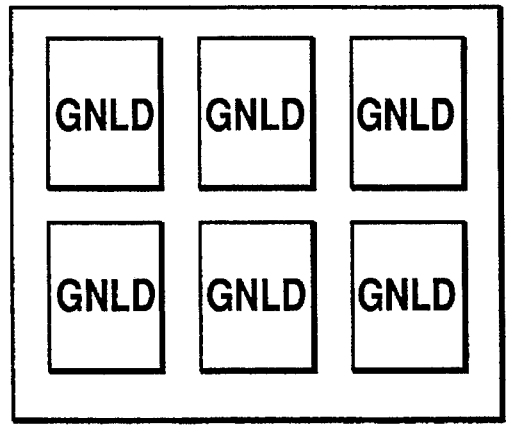
FIG. 11 depicts a layout of an integrated chaos device.

The configuration shown in FIG. 9 may comprise a combination of generalized nonlinear delay units (GNLD) illustrated in FIG. 10. FIG. 11 depicts an IC chip layout of a chaos device consisting of a plurality of generalized nonlinear delay units (GNLD). A wiring pattern for joining one unit to another is not shown in this layout.

An electronic circuit embodying the delay unit (LD) and the nonlinear delay unit (ND) as discussed hereinbefore will now be explained by way of example.

Figure 12:
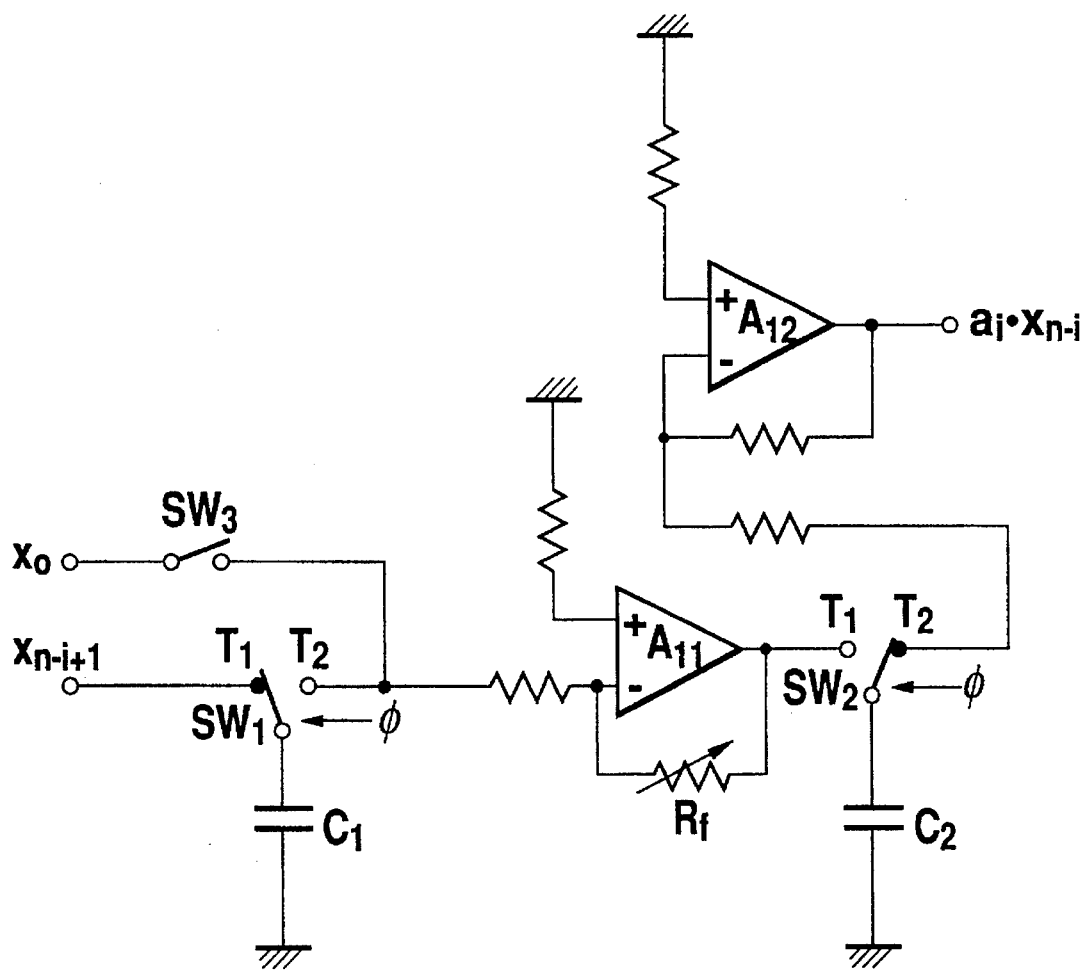
FIG. 12 is a circuit diagram showing an embodied circuitry of a linear delay unit.

FIG. 12 depicts a circuit embodying the linear delay unit (LD). For better understanding of the corresponding relationship of this figure with FIG. 5, input and output signals are designated by the same reference numerals as shown in FIG. 5.

Figure 13:
FIG. 13 is a waveform diagram showing a clock signal.

The delay elements comprise a couple of capacitors C1 and C2, and a couple of change-over switches SW1 and SW2. The change-over switches SW1 and SW2 are controllably changed over with the clock signal$\phi$ as shown in FIG. 13. The delay time $\Delta t$ corresponds to one period of the clock signal$\phi$. The coefficient element comprises an operational amplifier A11 including a feedback resistor Rf. A coefficient $a_i$ is changeable by a value of the resistor Rf. The initializing element comprises a switch SW3.

When the change-over switches SW1 and SW2 are connected to the terminals T2 and T1, respectively, and the switch SW3 is turned on, an initial value $x_0$ is allowed to be input. The input capacitor C1 is loaded under a voltage in accordance with a voltage signal representing the initial value $x_0$. The voltage at the capacitor C1 is multiplied by $-a_i$ with the aid of an inverting amplifier A11 for the storage within the output capacitor C2.

Next, upon the connection of the change-over switches SW1 and SW2 with the terminals T1 and T2, respectively, as shown, the input capacitor C1 is charged under a voltage corresponding to the input $x_{n-i+1}$. While on the contrary, the voltage at the output capacitor C2 is output in the form of the output $a_i.x_{n-i}$ by way of an inverting amplifier A12.

When the change-over switches SW1 and SW2 are again connected to the terminals T2 and T1, respectively, the voltage at the input capacitor C1 is multiplied by $-a_i$ to be stored within the output capacitor C2. In this manner, an input is fed in while an output is supplied to the outside every infinitesimal time $\Delta t$.

As described above, the change-over switches SW1 and SW2 and the switch SW3 may be realized by a semiconductor switching circuit. The switch SW3 may be manually directly or indirectly operated or controlled. A buffer circuit may be appropriately provided within such a linear delay unit or between such linear delay units.

Figure 14:
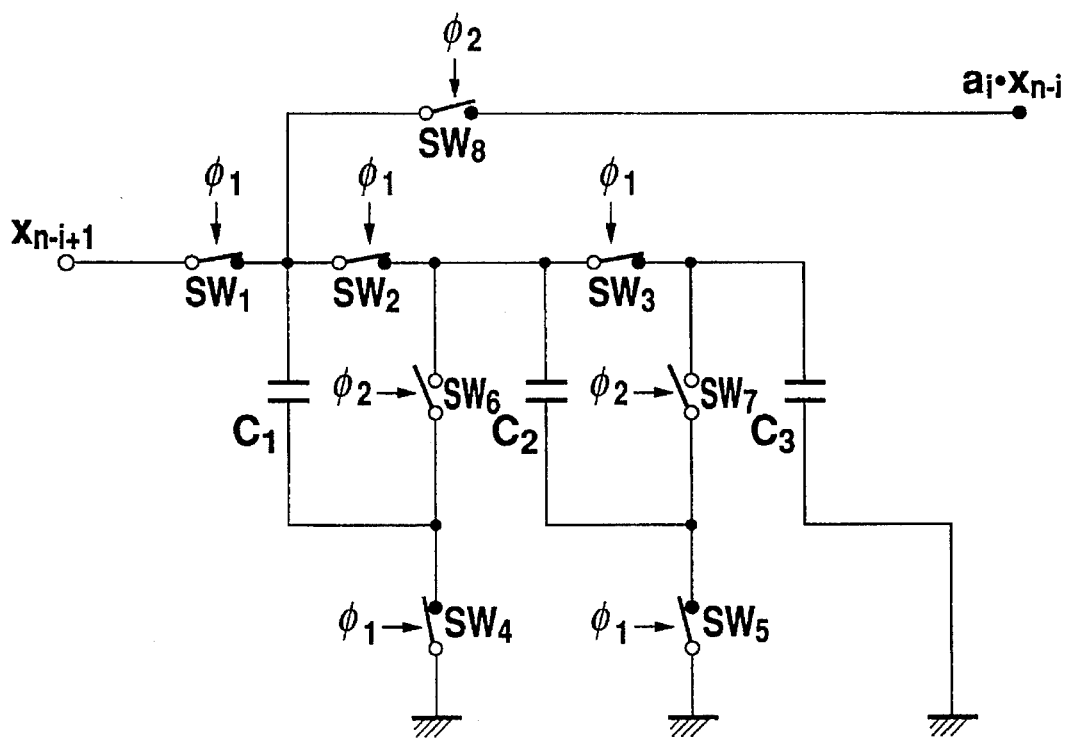
FIG. 14 is a circuit diagram showing another circuitry embodying the linear delay unit.

FIG. 14 illustrates, by way of example, another configuration embodying the linear delay unit (LD). In this figure and figures which will be referred to later, also, the switches or capacitors are designated by the same reference numerals SW1, SW2, . . . and C1, C2, . . . as in FIG. 12, which are merely repeatedly used for the convenience of avoiding complexity. It is to be appreciated that the reference numerals used in one of the figures are independent of those used in another.

Figure 15:
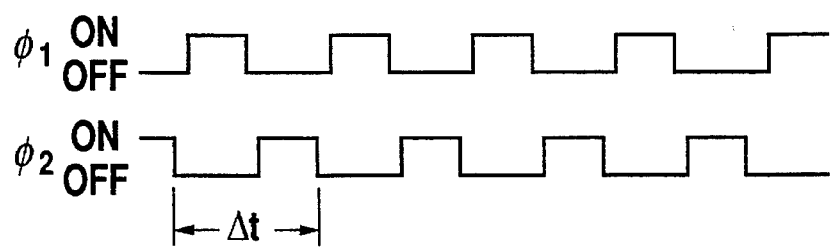
FIG. 15 is a waveform diagram showing clock signals.

A circuit shown in FIG. 14 comprises a plurality of (three in the figure) capacitors C1, C2, C3 and a plurality of switches SW1 to SW8. The switches SW1 to SW5 are controlled by a clock signal $\phi 1$, while the switches SW6 to SW8 are controlled by a clock signal $\phi 2$. The clock signal $\phi 1$ has a phase opposite to that of the clock signal $\phi 2$ as is clear from FIG. 15.

Figure 16A:
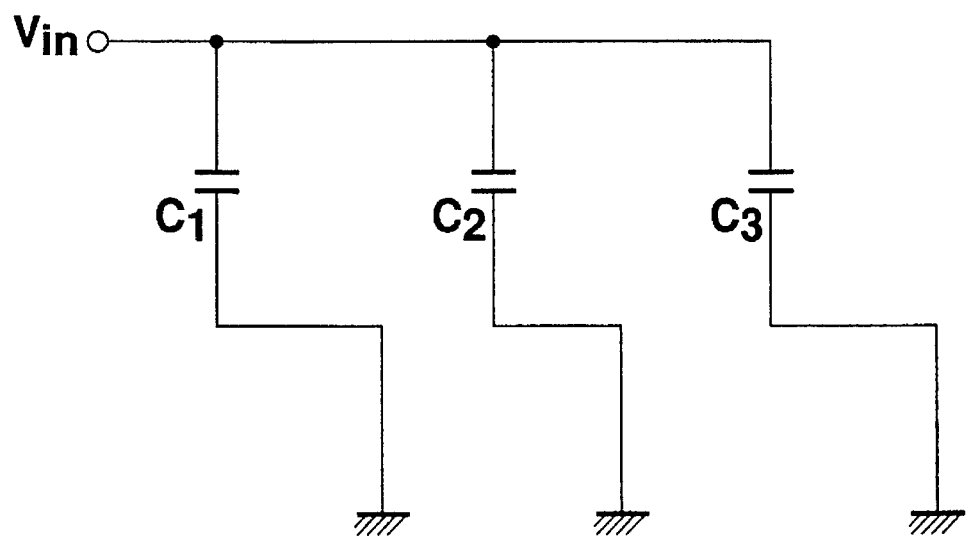
FIGS. 16A and 16B are equivalent circuit diagram at respective points in time showing the operation of the circuit illustrated in FIG. 14.

When the switches SW1 to SW5 are turned on under the control of the clock signal $\phi 1$, the switches SW6 to SW8 remain off. FIG. 16A illustrates a circuit to be established at that time. The three capacitors C1, C2, C3 being connected with one another in parallel are charged under the same voltage in compliance with an input voltage signal vin.

Figure 16B:
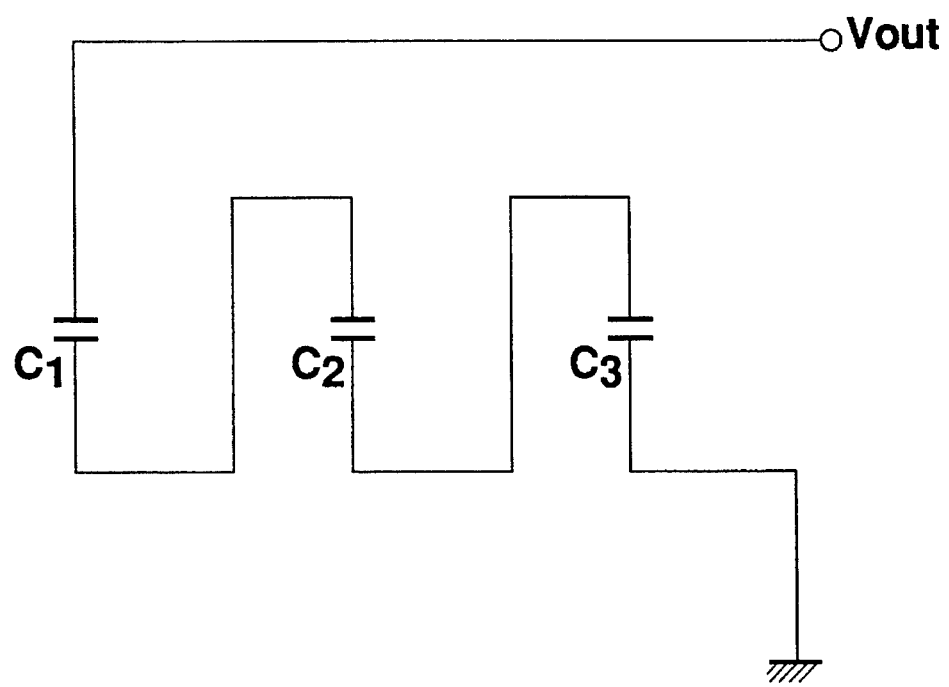

Thereafter, when the switches SW6 to SW8 are closed by the clock signal $\phi 2$, the switches SW1 to SW5 are caused to be open. FIG. 16B illustrates a circuit to be established at that time. The three capacitors C1, C2 and C3 are connected in series. Consequently, the resultant output signal vout can be represented as 3vin. As a result, the circuit shown in FIG. 14 presents an output three times as great as the input signal vin with a time delay of infinitesimal time $\Delta t$.

In the following description, the input signal $x_{n-i+1}$ and the output signal $x_{n-i}$ are replaced by the input signal vin and the output signal vout, respectively, for the simplification of notation in the same manner as shown in FIG. 16.

As with FIG. 14, a selective on-off control of the switches SW2 to SW7 enables the coefficient $a_i$ of the coefficient element to be changed.

In order to charge the capacitors C1 to C3, the switches SW1 to SW5 are turned on, whereas the switches SW6 to SW8 are turned off as shown in FIG. 16A.

Next, to derive the output vout from electric charge accumulated in the capacitors C1 to C3, the switches SW6 and SW8 are turned on, while the switch SW7 is left off. Further, the switches SW1, SW2 and SW4 are turned off, while the switches SW3 and SW5 are kept on. Thus, the capacitors C2 and C3 remain connected in parallel to present the output vout of 2vin. Depending on the operation of the switches SW1 to SW8, there can be obtained an output of vout=vin.

Instead of the foregoing, either or both of the switches SW2 and SW3 may be left on at all times, whereby electric charge stored in the capacitors C1 and C2 is permitted to be discharged when a corresponding one or both of the switches SW6 and SW7 is turned on, thus enabling the output voltage vout to be 2vin or vin.

In this manner, appropriate change of the on-off control of the switches SW1 to SW8 makes it possible to obtain a desired coefficient $a_i$. Furthermore, the increase in number of the capacitors to be connected may lead to an enhanced freedom to choose a value of the coefficient. More specifically, a multiplicity of capacitors and switches arranged in advance on an IC substrate may be configured as a mask programmable or field programmable logic array so as to obtain a desired coefficient $a_i$. This will also apply to other concrete circuits using a multiplicity of capacitors described later.

Initializing elements, although not shown in FIG. 14 for the purpose of avoiding complexity, may be added under an aspect shown in FIG. 12. The initializing element may consist in general of a switch and a capacitor for holding a voltage representing an initial value which is input when the switch is turned on. The same will apply to the other embodiment described later.

The circuit shown in FIG. 14 includes a plurality of capacitors connected in parallel and charged under an input voltage. By connecting these capacitors in series, there can be obtained an output (ai>1) having a voltage higher than the input voltage.

Figure 17:
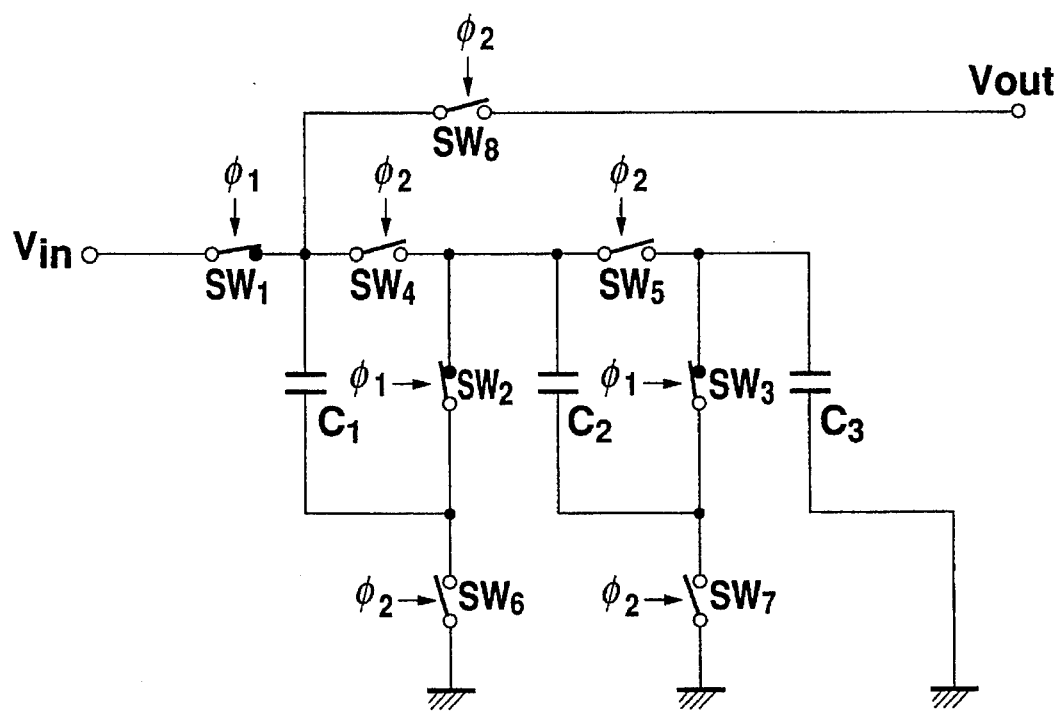
FIG. 17 is a circuit diagram showing further circuitry embodying the linear delay unit.

On the contrary, by connecting in parallel a plurality of capacitors which have been serially connected and charged under an input voltage, there can be obtained an output (ai<1) having a voltage lower than the input voltage. FIG. 17 illustrates an exemplary configuration thereof.

The circuit shown in FIG. 17 comprises a plurality of (three in the figure) capacitors C1, C2 and C3 and a plurality of switches SW1 to SW8. The switches SW1 to SW3 are controlled by a clock signal $\phi 1$, while the switch SW4 to SW8 are controlled by a clock signal $\phi 2$. The clock signals $\phi 1$ and $\phi 2$ are the same as those shown in FIG. 15.

Figure 18A:
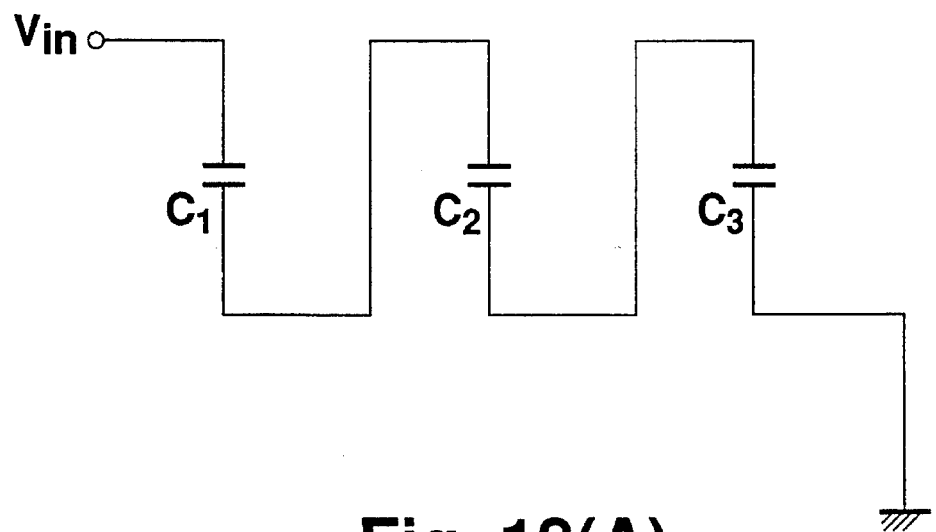
FIGS. 18A and 18B are equivalent circuit diagrams at respective points in time showing the operation of the circuit illustrated in FIG. 17.

When the switches SW1 to SW3 are turned on by the clock signal $\phi 1$, the switches SW4 to SW8 remain off. FIG. 18A illustrates a circuit to be established at this time. Three capacitors C1, C2 and C3 are connected in series and charged in compliance with the input voltage signal vin.

Figure 18B:
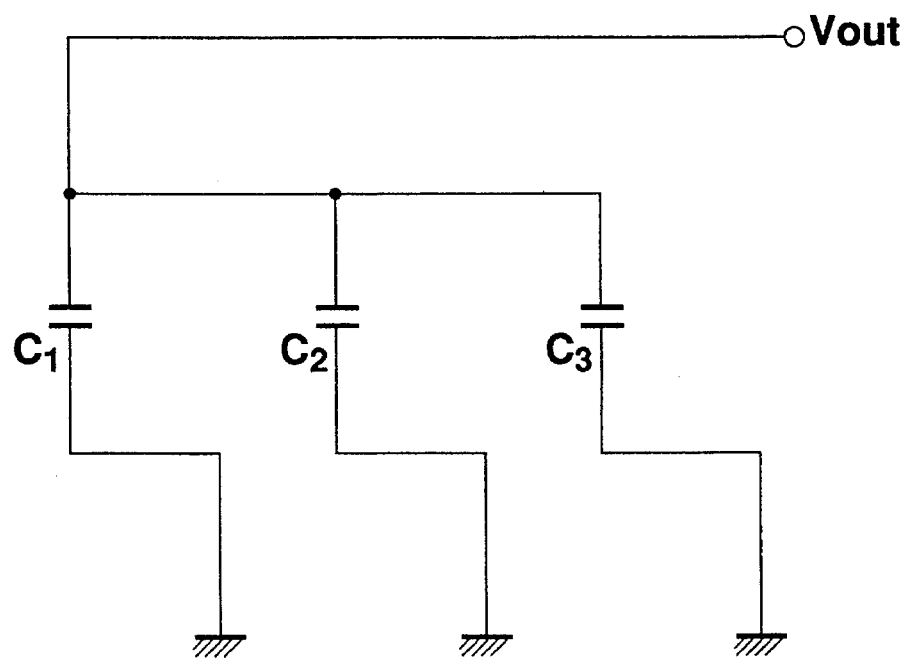

Afterwards, when the switches SW4 to SW8 are closed by the clock signal $\phi 2$, the switches SW1 to SW3 become open. FIG. 18B illustrates the thus established circuit in which the three capacitors C1, C2 and C3 are connected in parallel. Therefore, if C1=C2=C3, then the output signal vout is vin/3. In other words, the circuit shown in FIG. 17 is allowed to produce an output 1/3 times the input signal vin with a delay of infinitesimal time $\Delta t$.

Depending on the manner of setting values of the capacitors C1, C2 and C3, there can be obtained an arbitrary coefficient ai (ai<1).

For example, let C1=4C, C2=2C, C3=C, where C means a unit capacitance. In FIG. 18A, the capacitors C1, C2 and C3 each have an equally accumulated electric charge. Let the equally accumulated electric charge be Q, and let the voltage at both ends of each of the capacitors C1, C2, and C3 be v1, v2, and v3, respectively. Then, the following expressions are established with respect to the capacitors C1, C2 and C3.

$$Q=4Cv1 \qquad \ldots \text{Expression 26}$$

$$Q=2Cv2 \qquad \ldots \text{Expression 27}$$

$$Q=Cv3 \qquad \ldots \text{Expression 28}$$

On the other hand, $$vin=v1+v2+v3 \qquad \ldots \text{Expression 29}$$

Hence, $$Q/C=(4/7) \, vin \qquad \ldots \text{Expression 30}$$

While on the contrary, in FIG. 18, the electric charge of 3Q is redistributed among the three capacitors C1, C2 and C3. The amount of the electric charge to be stored within the capacitors C1, C2 and C3 is 4Cvout, 2Cvout and Cvout, respectively, and accordingly, the following expression is obtained.

$$4Cvout+2Cvout+Cvout=7Cvout=3Q \qquad \ldots \text{Expression 31}$$

Expressions 30 and 31 lead to $$vout = (3/7)(Q/C) = (3/7)(4/7) \, vin \qquad \text{Expression 32}$$
$$= (12/49) \, vin$$

It is to be noted also in FIG. 17 that a selective on-off control of the switches SW2 to SW7 ensures an arbitrary change in the coefficient ai of the coefficient element.

Figure 19:
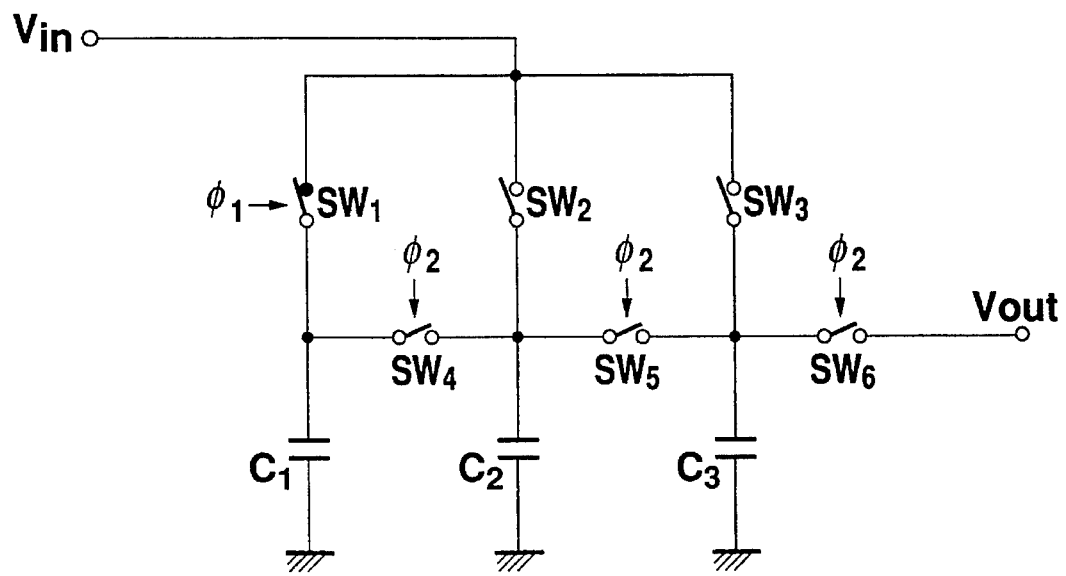
FIG. 19 is a circuit diagram showing still another circuitry embodying the linear delay unit.

FIG. 19 illustrates a still further embodiment, in which any one of, or two of, or all of the capacitors C1, C2 and C3 are loaded under the input voltage vin, and then the electric charge accumulated in the loaded capacitor(s) is redistributed among the three capacitors to derive an output voltage vout therefrom.

For instance, the switch SW1 is only turned on with the aid of the clock signal $\phi 1$. Other switches SW2 to SW6 are kept off. As a result, the capacitor C1 is charged under the input voltage vin. Thereafter, the clock signal $\phi 2$ is used to turn on the switches SW4 to SW6. The other switches SW1 to SW3 are left off. Then, the electric charge accumulated in the capacitor C1 is distributed among the other capacitors C2 and C3, and the output vout of a voltage depending on the configuration of these capacitors is produced. Hence, vout vin, that is, ai<1 is established.

In lieu of closing the switch SW1, the switch SW2 may be closed with the aid of the clock signal $\phi 1$, thereby allowing capacitor C2 to be charged. Alternately, the switch SW3 may be closed so as to allow the capacitor C3 to be charged, or two of the switches SW1 to SW3 may be closed to allow the charge of the corresponding two capacitors.

Figure 20:
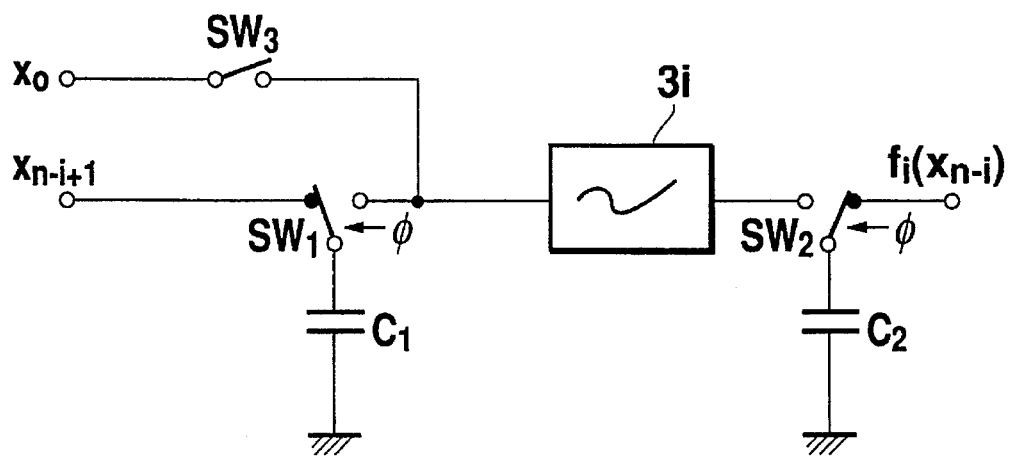
FIG. 20 is a circuit diagram showing a circuitry embodying a nonlinear delay unit.

FIG. 20 illustrates an exemplification of the nonlinear delay unit (ND). For better understanding of the correspondency to FIG. 6, the input and output signals are designated by the same reference numerals as those used in FIG. 6. An embodiment of the nonlinear function element 3i will be discussed later.

Figure 21:
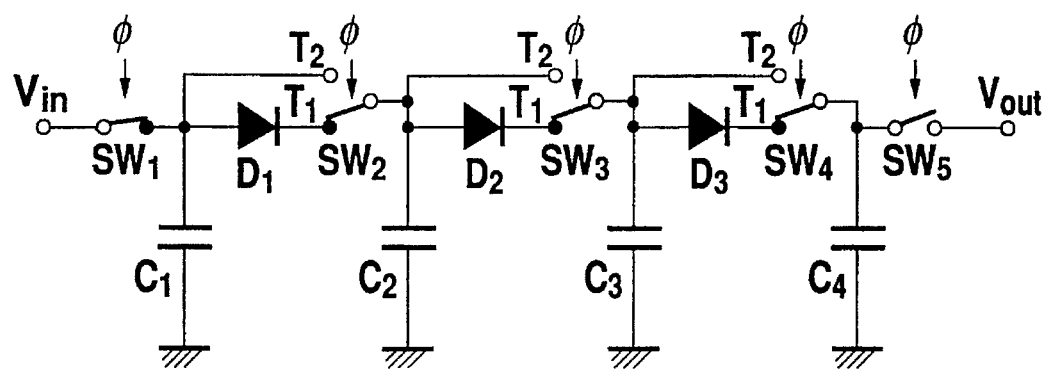
FIG. 21 is a circuit diagram showing another circuit embodying the linear delay unit.

FIG. 21 depicts an embodiment of the nonlinear delay unit (ND) comprising capacitors C1 to C4, diodes D1 to D3, and switches SW1 to SW5. For simplification, assume C1=C2=C3=C4.

Figure 22A:
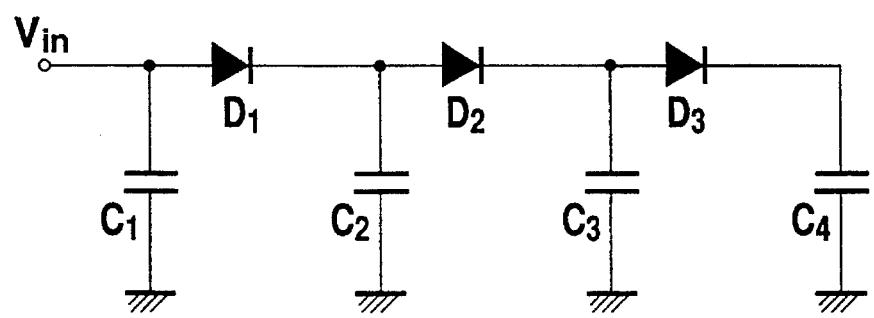
FIGS. 22A and 22B are equivalent circuit diagrams at respective points in time showing the operation of the circuit illustrated in FIG. 21.

FIG. 22A represents a charging state in which by virtue of a clock signal $\phi$ the switch SW1 is on, the change-over switches SW2 to SW4 are brought into contact with corresponding terminals T1, and the switch SW5 is off. Let vD be a forward drop voltage of the diodes D1 to D3.

If the input voltage vin≦VD, then only the capacitor C1 is allowed to be charged. If VD<Vin≦2VD, then the capacitors C1 and C2 are allowed to be charged. If 2vD<vin ≦3vD, then the capacitors C1, C2 and C3 are charged. If 3vD <vin, then all of the capacitors C1 to C4 are subjected to a charge. In this manner, the number of capacitors to be charged depends on the magnitude of the input voltage vin.

Figure 22B:
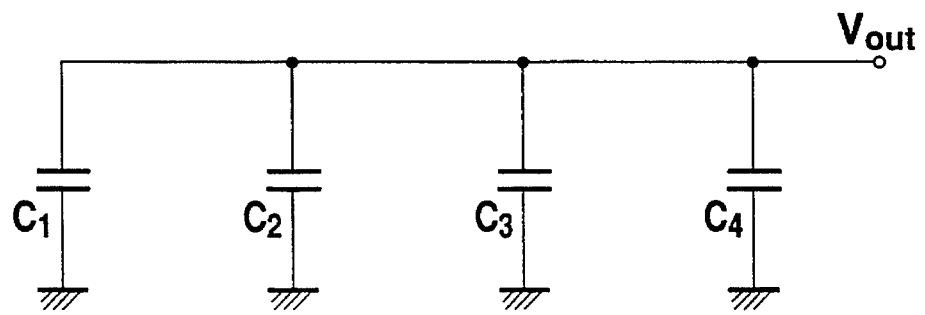

Moreover, FIG. 22B represents a state of producing an output voltage in which by virtue of the clock signal $\phi$ the switch SW1 is off, the change-over switches SW2 to SW4 are brought into contact with corresponding terminals T2, and the switch SW5 is on. All of the capacitors C1 to C4 are connected in parallel, so that the electric charge in the first charged capacitor is distributed among all the remaining capacitors.

Figure 23:
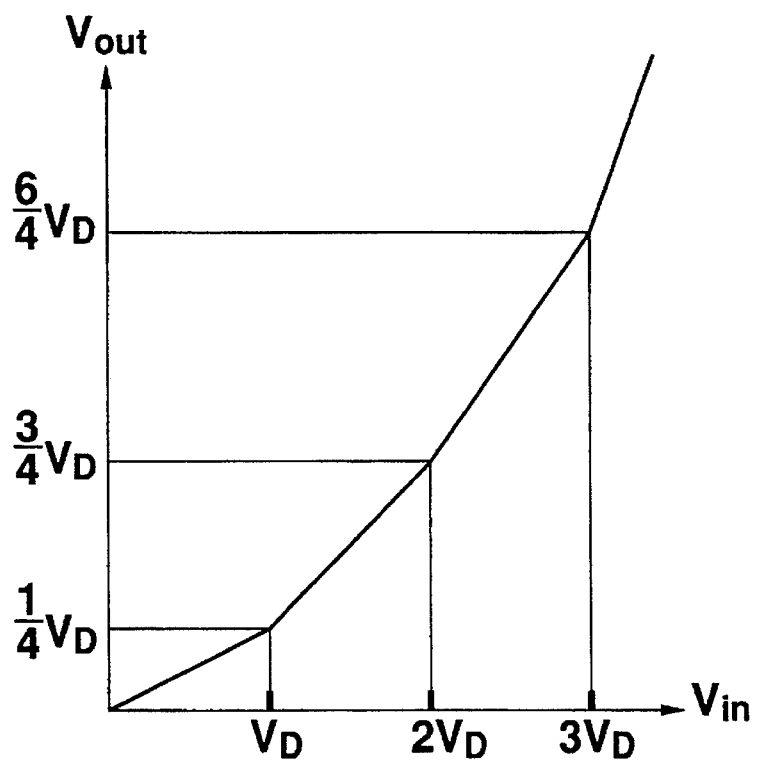
FIG. 23 is a graph showing an input/output characteristic of the circuit illustrated in FIG. 21.

The number of capacitors to be charged and the quantity of electric charge depend on the magnitude of the input voltage vin. Hence, input voltage vin/output voltage vout characteristic can be represented as FIG. 23. This characteristic is a nonlinear one. More specifically, in the case of the circuit shown in FIG. 21, the output voltage vout which is obtained by converting the input voltage vin through the nonlinear characteristic shown in FIG. 23 is permitted to be output with a delay of infinitesimal period $\Delta t$ with respect to the input point of the input voltage vin.

Figure 24:
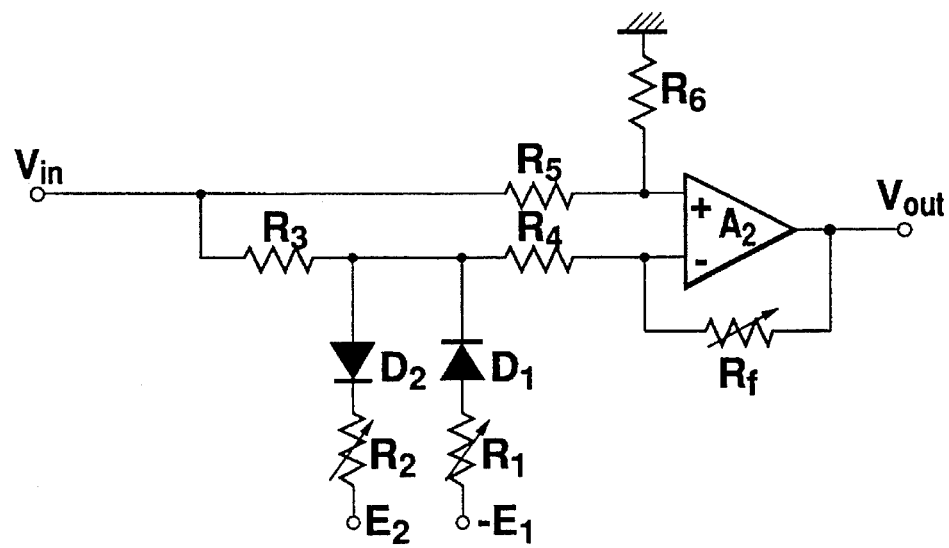
FIG. 24 is a circuit diagram showing an embodiment of the nonlinear function element.

FIG. 24 illustrates, by way of example, an electronic circuit embodying the nonlinear function element 3i. This circuit includes a nonreversing operational amplifier A2 having a feedback adjustable resistor Rf. An input voltage vin is supplied through input resistors to positive and negative input terminals of the amplifier A2. With respect to the negative input terminal of the amplifier A2, a couple of diodes D1 and D2 (although these diodes are also designated by the same reference numerals as those shown in FIG. 21, there is no corresponding relationship between them) are connected through the input resister in parallel and with opposite polarity to each other. A voltage of −E1 is applied through the adjustable resistor R1 to the anode of one diode D1, while a voltage of +E2 is applied through the adjustable resistor R2 to the cathode of the other diode D2. The output voltage vout is derived from the output terminal of the amplifier A2.

Figure 26A:
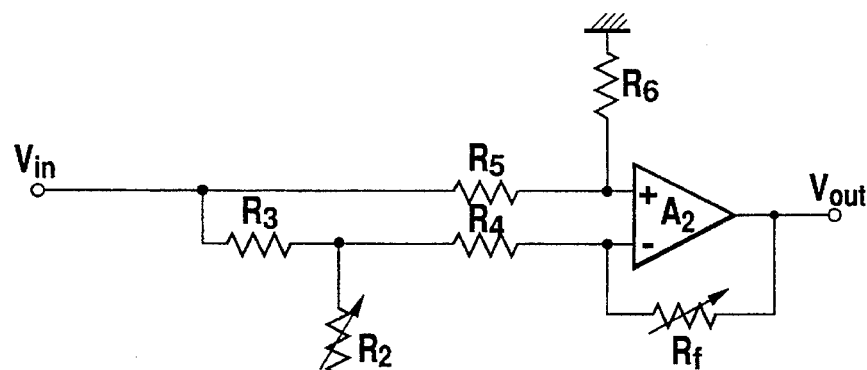
FIGS. 26A, 26B and 26C are equivalent circuit diagrams at respective ranges of input signals showing the operation of the circuit illustrated in FIG. 24.

Now, providing the forward drop voltage vD of the diode is ignored and the input voltage vin satisfies $$vin \geq \frac{(R3+R4)(R5+R6)}{R4R5+R4R6+R3R6} E2 \qquad \text{Expression 33}$$

then, the only diode D2 is conductive, and the circuit shown in FIG. 24 can be represented in the form of FIG. 26A. This circuit exhibits a positive amplification degree which can be adjusted by at least any one of the resistors R2 and Rf.

Figure 26B:
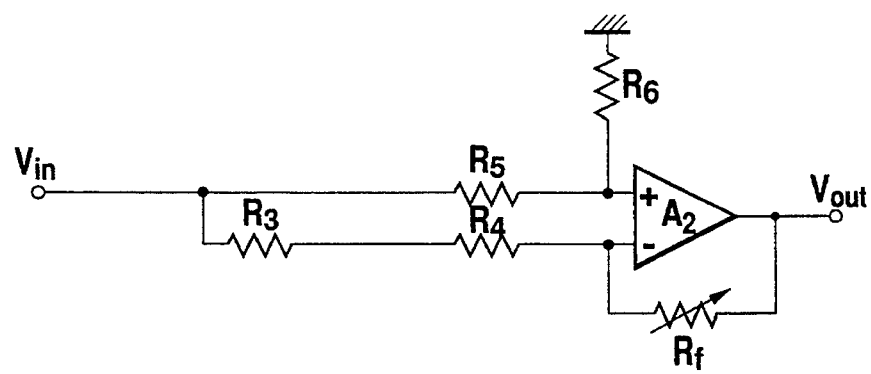

Providing the input voltage vin satisfies $$-\frac{(R3+R4)(R5+R6)}{R4R5+R4R6+R3R6} E1 \leq vin < \qquad \text{Expression 34}$$

$$\frac{(R3+R4)(R5+R6)}{R4R5+R4R6+R3R6} E2$$

then, the diodes D1 and D2 are both nonconductive, and the circuit shown in FIG. 24 can be represented in the form of FIG. 26B. Through an appropriate choice of the feedback resistor Rf of the amplifier A2, a negative amplification degree can be imparted to the circuit.

Figure 26C:
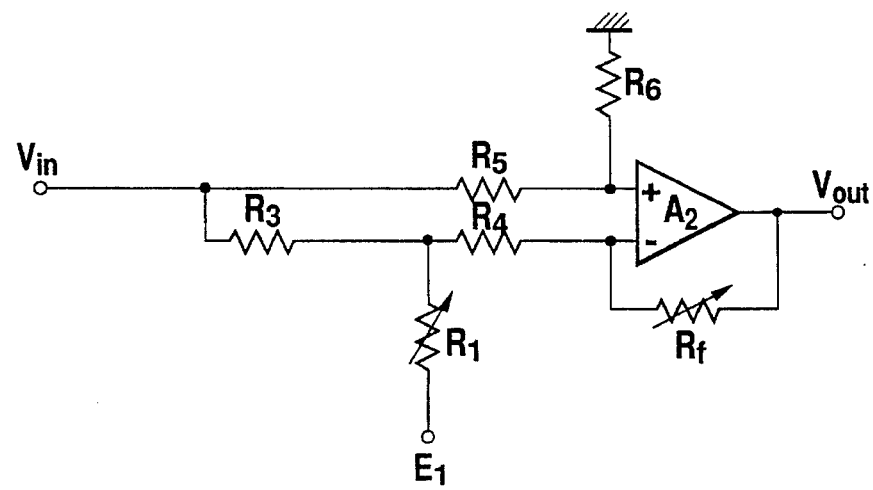

Providing the input voltage vin satisfies $$vin < -\frac{(R3+R4)(R5+R6)}{R4R5+R4R6+R3R6} E1 \qquad \text{Expression 35}$$

then, the diode D1 is only conductive, and the circuit shown in FIG. 26C is established. This circuit also exhibits a positive amplification degree which is capable of being adjusted by at least any one of the resistors R1 and Rf.

Figure 25:
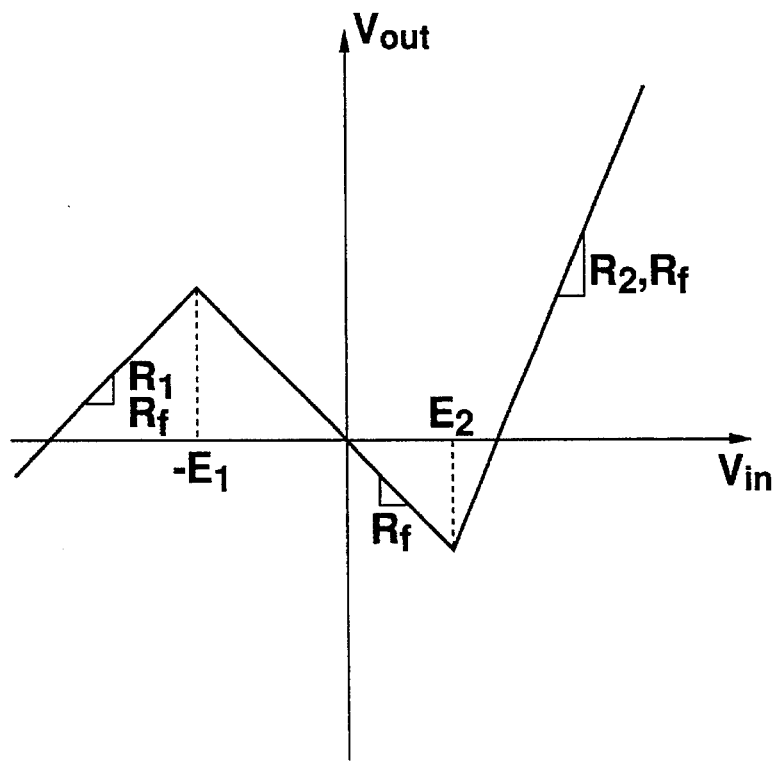
FIG. 25 is a graph showing an input/output characteristic of the circuit illustrated in FIG. 24.

Therefore, the input/output characteristic of the circuit shown in FIG. 24 presents a nonlinearity as shown in FIG. 25.

The various kinds of electronic circuits described above are all designed to function in voltage mode.

The following is a description of embodiments of a linear delay unit (LD) and a nonlinear delay unit (ND) which are operated in current mode.

Figure 27:
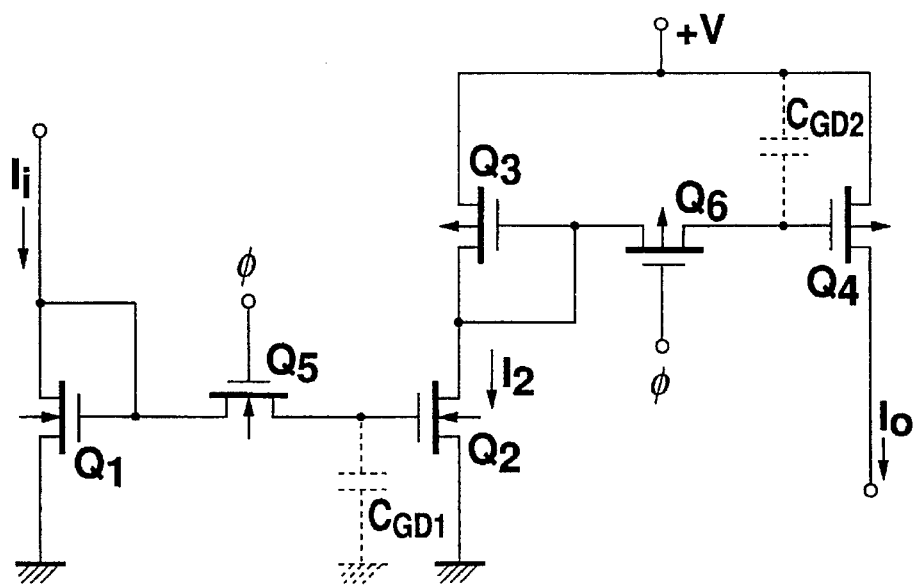
FIG. 27 is a circuit diagram showing circuitry embodying a linear delay unit operating in current mode.

FIG. 27 illustrates, by way of example, a circuit embodying the linear delay unit (LD) which works in current mode. The circuit comprises a couple of switched current mirrors. The switched current mirror resting on the input side includes nMOS(n-channel metal oxide semiconductor)FET-(field-effect transistor's Q1 and Q2 constituting a current mirror, and an nMOSFET Q5 serving as a switching element and connected between gates of the FET's Q1 and Q2. An input signal is imparted to the FETQ1 in the form of a current Ii. The switched current mirror lying on the output side includes pMOS(p-channel metal oxide semiconductor)FET's Q3 and Q4 constituting a current mirror, and a pMOSFET Q6 acting as a switching element and connected between gates of the FET's Q3 and Q4. An output signal is derived from the FETQ4 in the form of current I0. The FET's Q5 and Q6 each functioning as the switching element are controlled by a clock signalϕ (refer to FIG. 13).

When the clock signalϕ is high, the FET's Q5 and Q6 are on and off, respectively. With the FET Q5 on, the current mirror on the input side is operated. Thus, when the FET Q1 receives an input current Ii, corresponding current I2 is allowed to flow into the FET Q2.

Let a ratio of channel width to channel length (referred to as W/L ratio hereinbelow) of the FET Q1 and a W/L ratio of the FET Q2 be W1/L1 and W2/L2, respectively, the current I2 can be written as $$I2=[(W2/L2)/(W1/L1)]Ii \qquad \text{... Expression 36}$$

At that time, a parasitic capacitor CGDI located between the gate and the drain of the FET Q2 stores an electric charge corresponding to the current I2 and representing a voltage equal to the gate voltage. The current I2 is allowed to flow into the FET Q3 to cause a voltage drop corresponding to the current I2 between the gate and the drain of the FET Q3.

Thereafter, when the clock signal becomes low, the FET's Q5 and Q6 become off and on, respectively. Therefore, the current mirror is actuated. That is, a voltage arising from the electric charge accumulated within the capacitor CGD1 continues to force the current I2 to flow into the FET's Q2 and Q3, while a capacitor CGD2 is charged through the energized FET Q6 up to the voltage equal to the voltage drop between the gate and drain of the FET Q3 which may appear at that time. As a result, the FET Q4 situated on the output side receives corresponding output current I0. Let a W/L ratio of the FET Q3 and a W/L ratio of the FET Q4 be W3/L3 and W4/L4, respectively, the output current I0 can be written as $$\begin{aligned} I0 &= [(W4/L4)/(W3/L3)]I2 \qquad \text{Expression 37}\\ &= [(W4/L4)/(W3/L3)] \cdot \\ &\quad [(W2/L2)/(W1/L1)]Ii \\ &= ai \cdot Ii \\ ai &= [(W4/L4)/(W3/L3)] \cdot \qquad \text{Expression 38}\\ &\quad [(W2/L2)/(W1/L1)] \end{aligned}$$

In consequence, the output current I0 has a current value ai times as great as the input current Ii, and is output with a delay of infinitesimal time Δt with respect to the input point of the input current Ii. Preferably, a coefficient ai is adjusted through the ratios W4/L4 and W1/L1.

Such a current mode circuit is suitable for integration because of its wired sum and fewer number of components. For example, comparisons with the linear delay unit in voltage mode shown in FIG. 12 will be made hereinbelow.

The linear delay unit (LD) in voltage mode shown in FIG. 12 requires three resistors, which may result in a greater area being required to accommodate them. In order to realize the operational amplifiers and switches involved therein using the transistors, there may be needed 11 to 20 transistors. It also requires at least two capacitors.

While on the contrary, the linear delay unit (LD) in current mode shown in FIG. 27 requires no resistors. It does not need any capacitors, either, because it makes use of the gate capacitance of the FET. As is apparent from FIG. 27, only six transistors are required to be provided therein.

Figure 28:
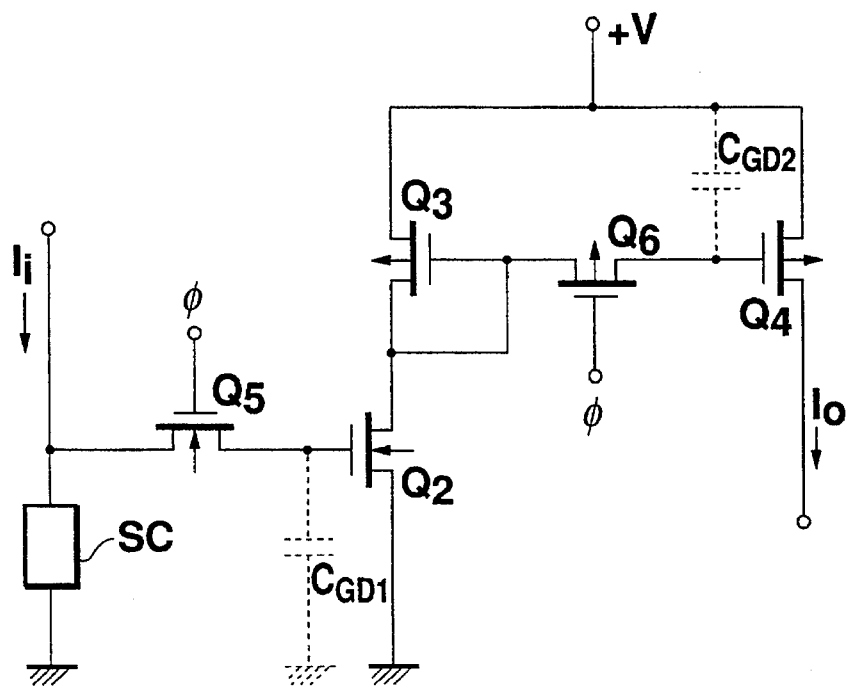
FIG. 28 is a circuit diagram showing circuitry embodying a nonlinear delay unit operating in current mode.

Referring next to FIG. 28, description will be given of a current mode circuit embodying the nonlinear delay unit (ND).

In FIG. 28, identical reference numerals are imparted to the same elements as those shown in FIG. 27.

By comparison with the circuit in FIG. 27, the circuit in FIG. 28 includes a nonlinear function element SC in place of the FET Q1 lying on the input side. This nonlinear function element SC exhibits a nonlinear current/voltage characteristic, which may be realized by, for example, a thyristor. It may be externally provided on the IC, or alternatively may be embedded within the IC chip.

Since the capacitor CGD1 stores an electric charge representing a voltage subjected to a nonlinear conversion with respect to the input current Ii, the circuit shown in FIG. 28 produces a nonlinearly converted output current I0 after the lapse of time Final description will be made of an applied example of the chaos device discussed above.

A simplest configuration shown in FIG. 1 is implemented by computer software, a simulation result based on which will be explained.

Expressions 1 and 2 are rewritten as follows.

$$xn+1=f(xn)+a2yn \qquad \text{...Expression 39}$$

$$yn+1=xn \qquad \text{...Expression 40}$$

A nonlinear function f(xn) is expressed in the form $$f(xn) = a1x + \frac{x + \cos x^2}{1+x^2} \qquad \text{Expression 41}$$

where a1 and a2 denote a constant (a parameter).

Figure 29:
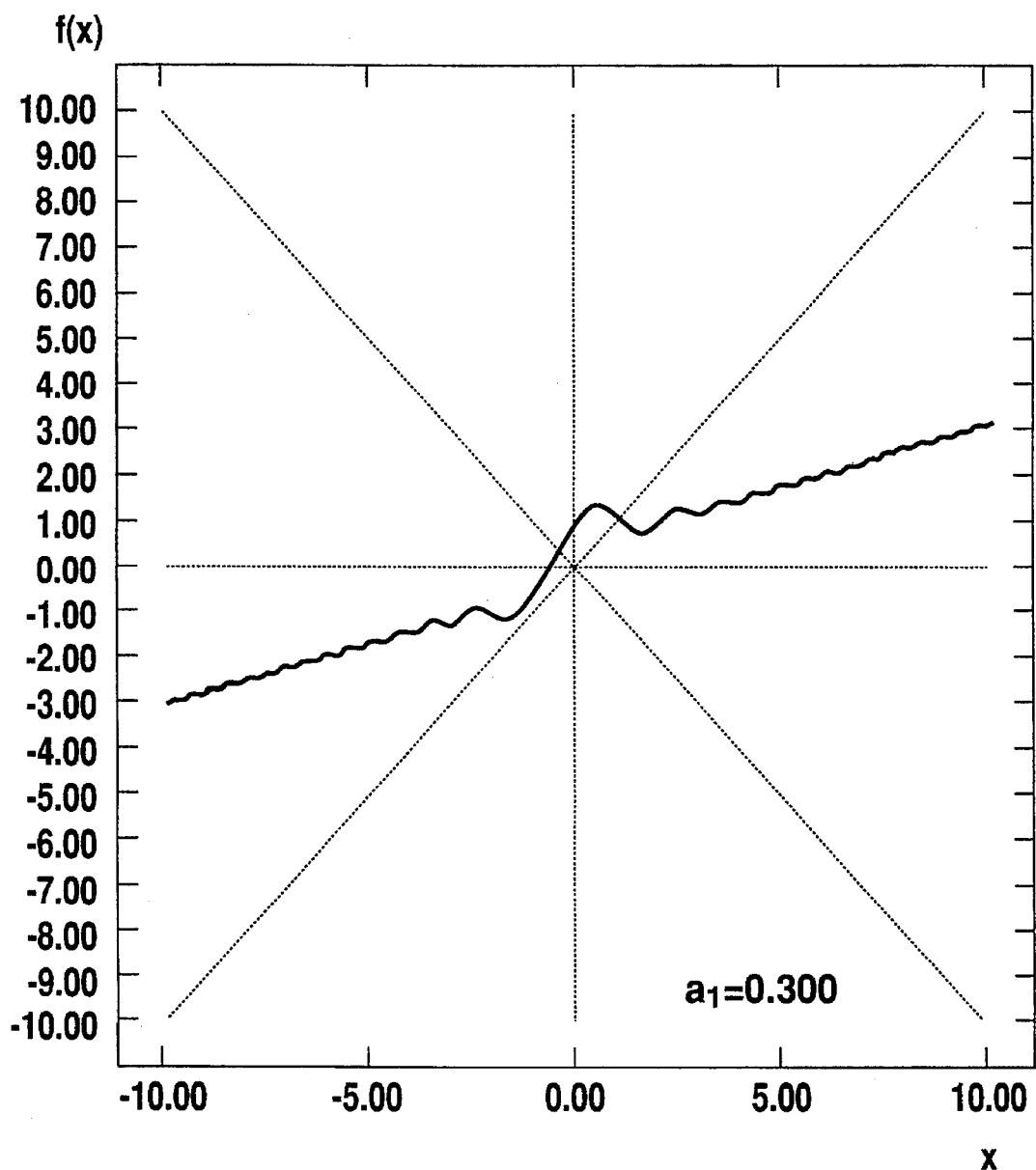
FIG. 29 is a graph showing an example of characteristics of the nonlinear function.

The nonlinear function f(x) represented by Expression 41 describes a curve shown in FIG. 29. Let a1=0.300.

FIGS. 30 through 34 plot on XY coordinates a set pf points designating (xn, yn) obtained from Expressions 39 through 41. With n=1 to 20000, there appear 20001 points thereon including the initial value (x0, y0).

Figure 30:
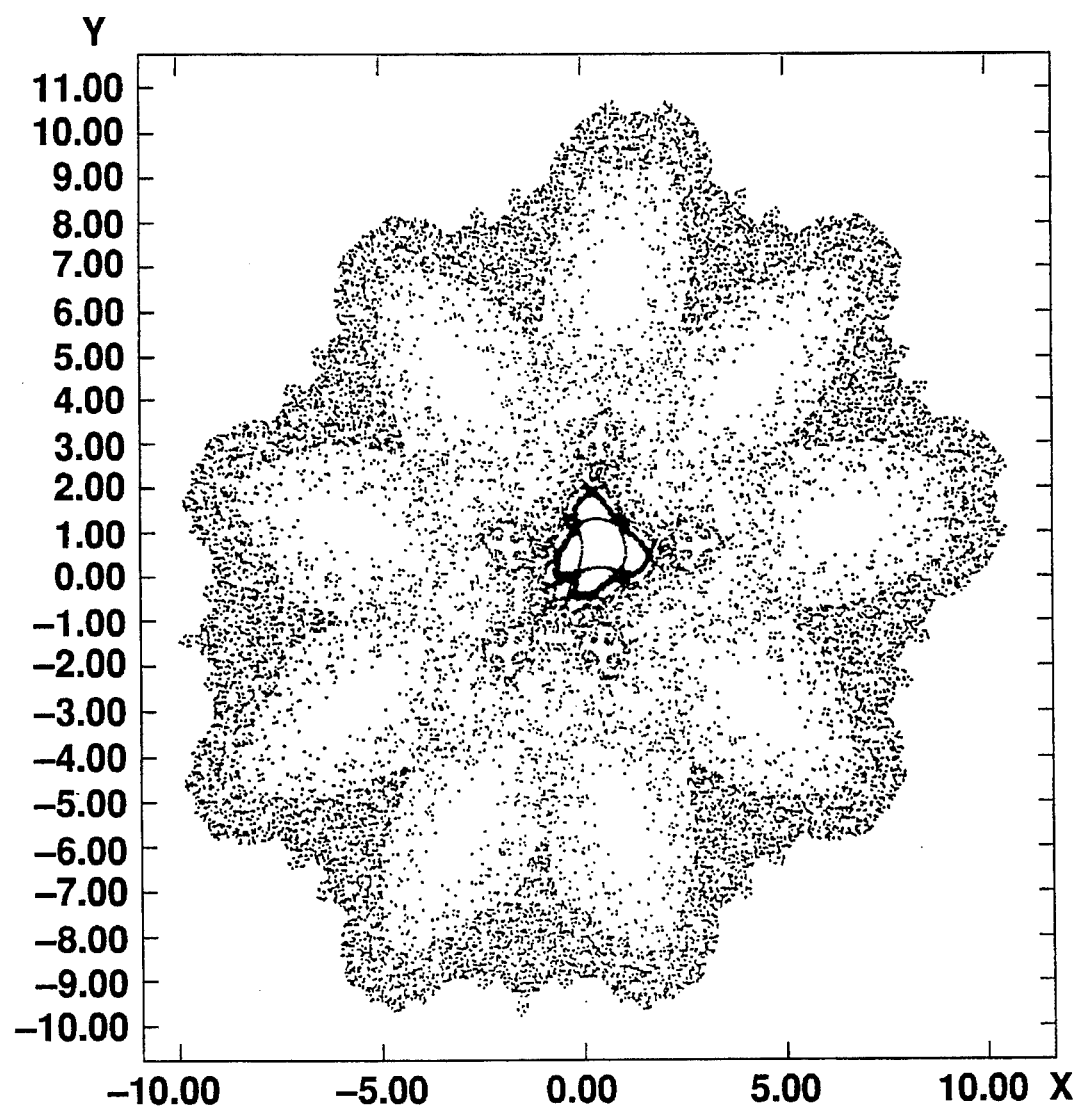
FIG. 30 shows a pattern described by output signals derived from an apparatus for generating chaotic signals which includes a nonlinear function illustrated in FIG. 29 and includes a functional configuration illustrated in FIG. 1.

FIG. 30 illustrates a pattern obtained under the conditions of initial values x0=0.000, y0=0.000; and parameters a1=0.300, a2=−1.000.

Figure 31:
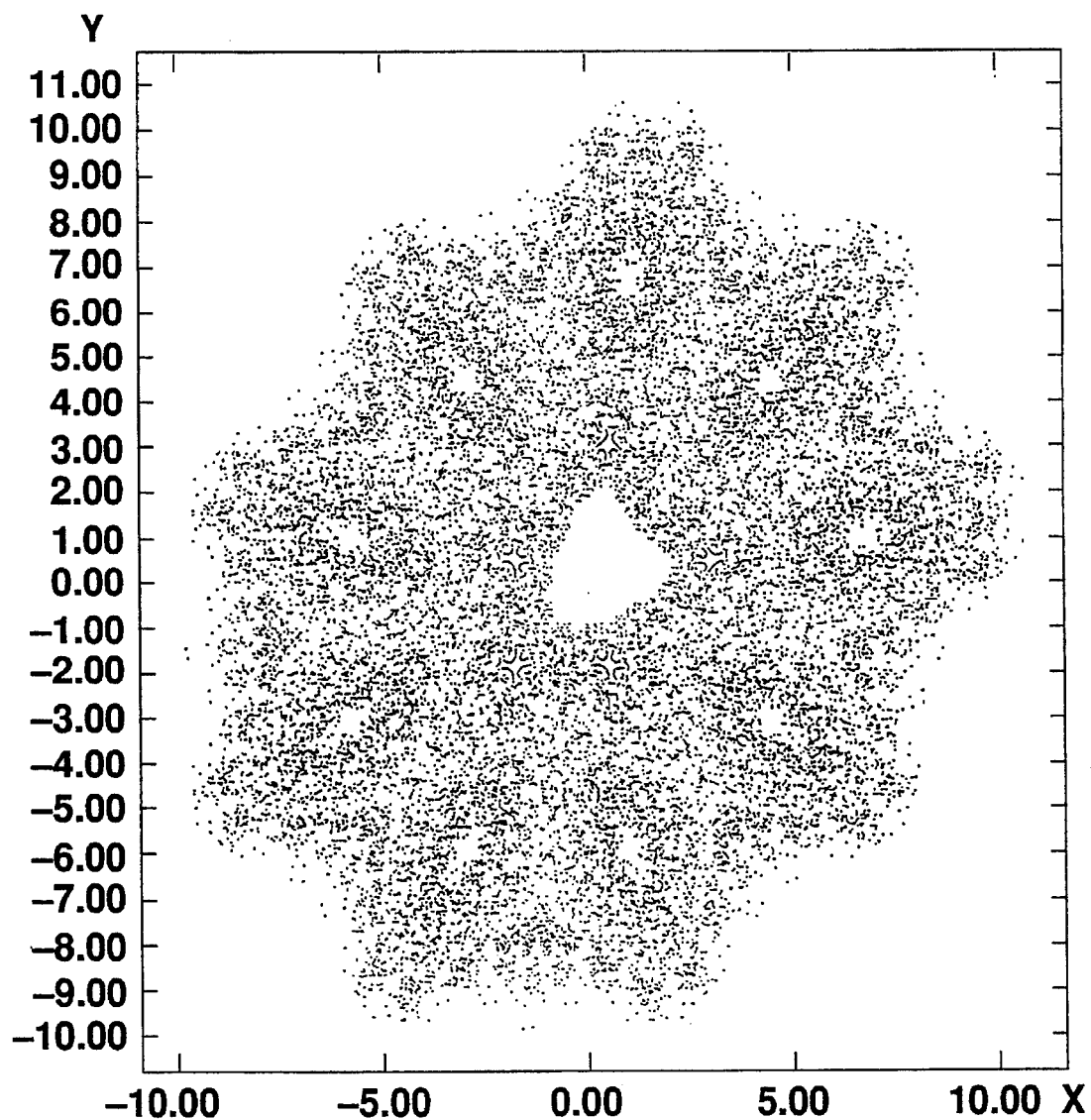
FIG. 31 shows another example of a pattern described by the chaotic signals.

FIG. 31 depicts a pattern obtained by changing the initial values into x0=5.000 and y0=5.000 with the parameters fixed (pa1=0.300, a2=−1.000). It will be seen from these figures that the change of the initial values may bring about a substantial change in the pattern consisting of a set of points.

Figure 32:
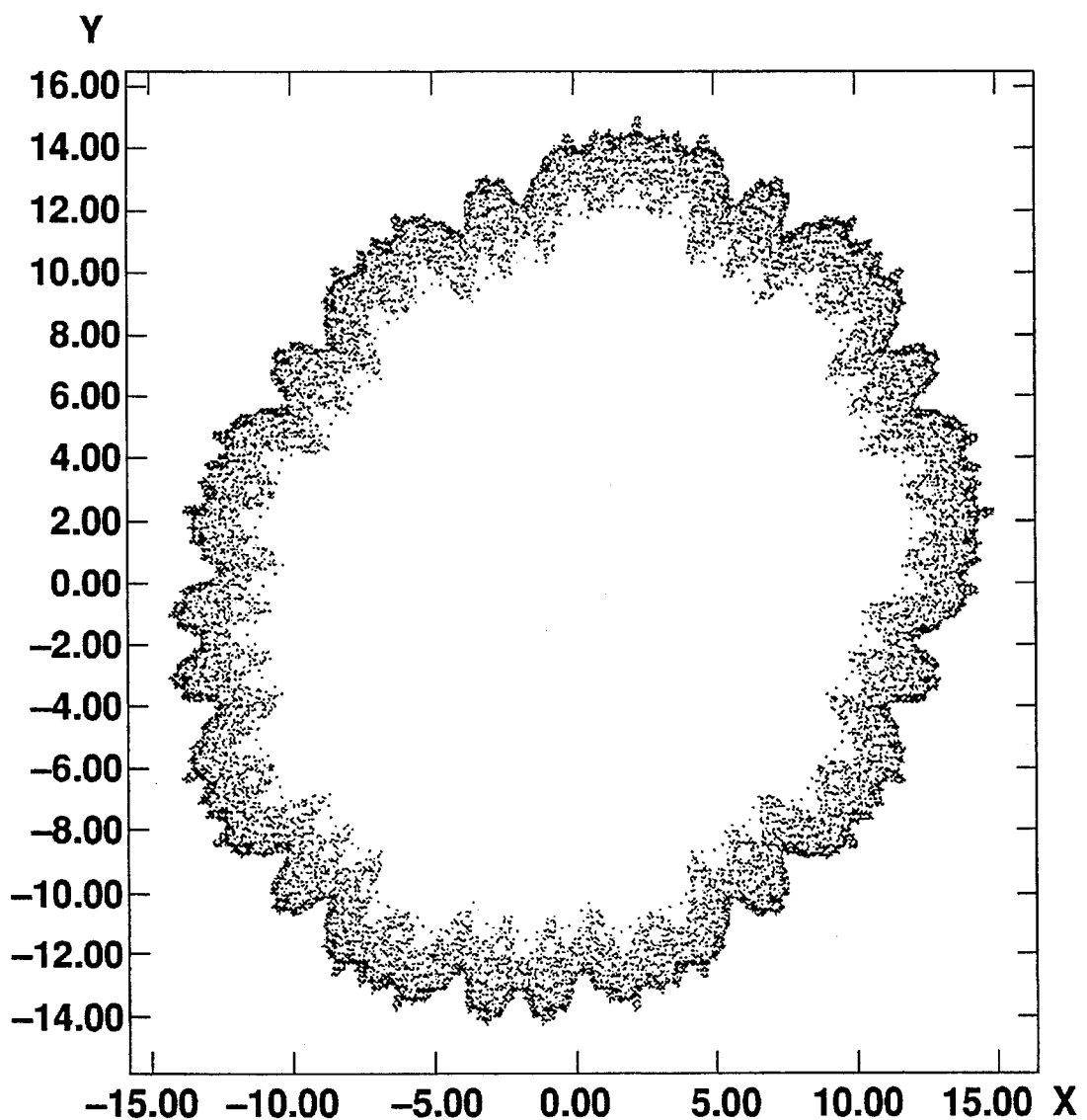
FIG. 32 illustrates a further example of a pattern described by the chaotic signals.

FIG. 32 represents a case where the parameters (a1=0.300, a2=−1.000) remain fixed and the initial values have been further changed into x0=10.000 and y0=10.000. The pattern consisting of a set of points undergoes a further transformation.

Figure 33:
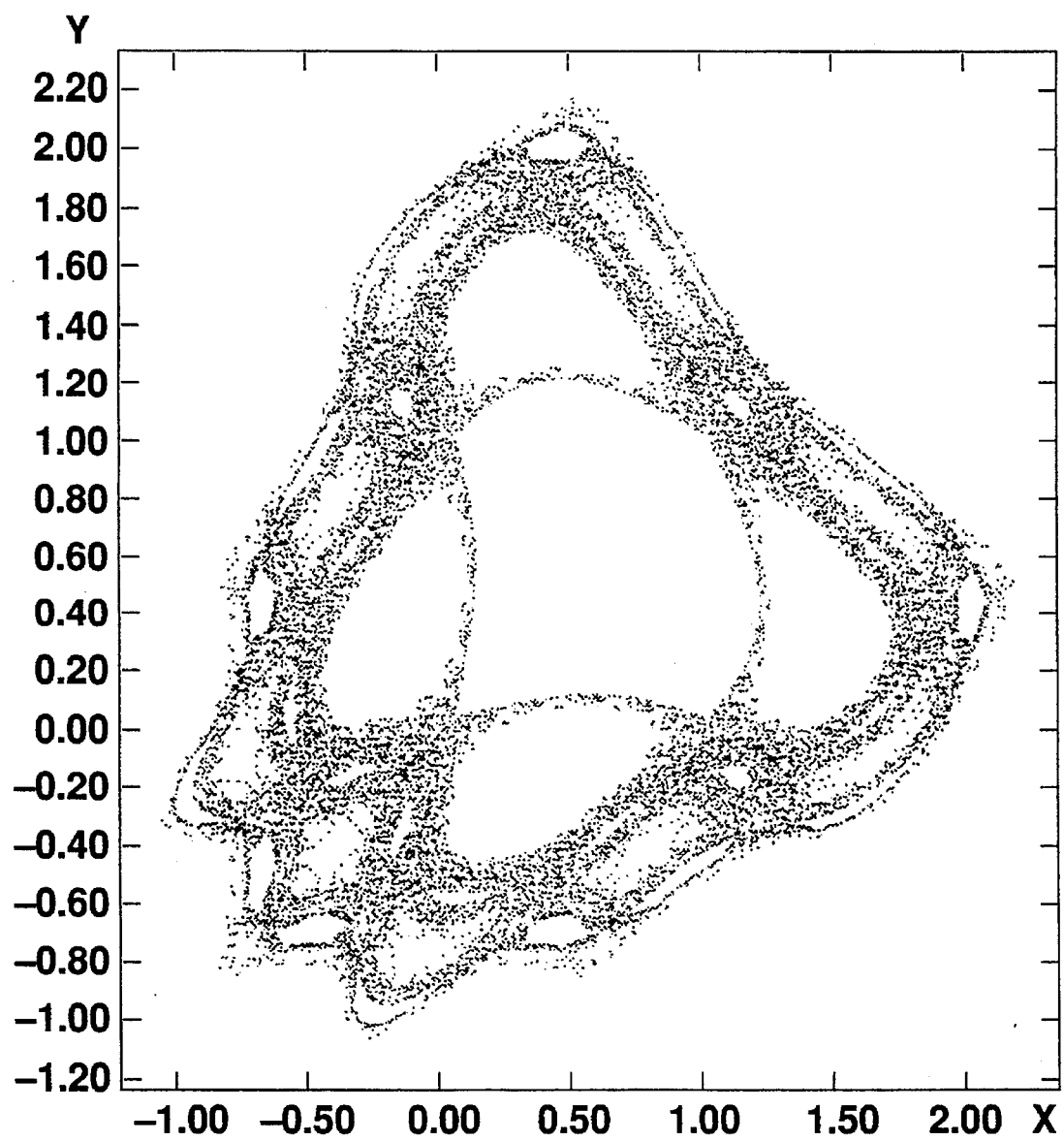
FIG. 33 represents a still another example of a pattern described by the chaotic signals.

FIG. 33 shows a pattern obtained in the case where the initial values are the same as those in FIG. 30 (x0=0.000, y0=0.000) and one parameter has been slightly changed into a1=0.290 (a2=−1.000 remains fixed). Unlike the case in FIG. 30, the pattern is substantially confined within the range −1≦x, y≦+2. It will be appreciated from the figure that a slight change of the parameters may cause a great change in the pattern.

Figure 34:
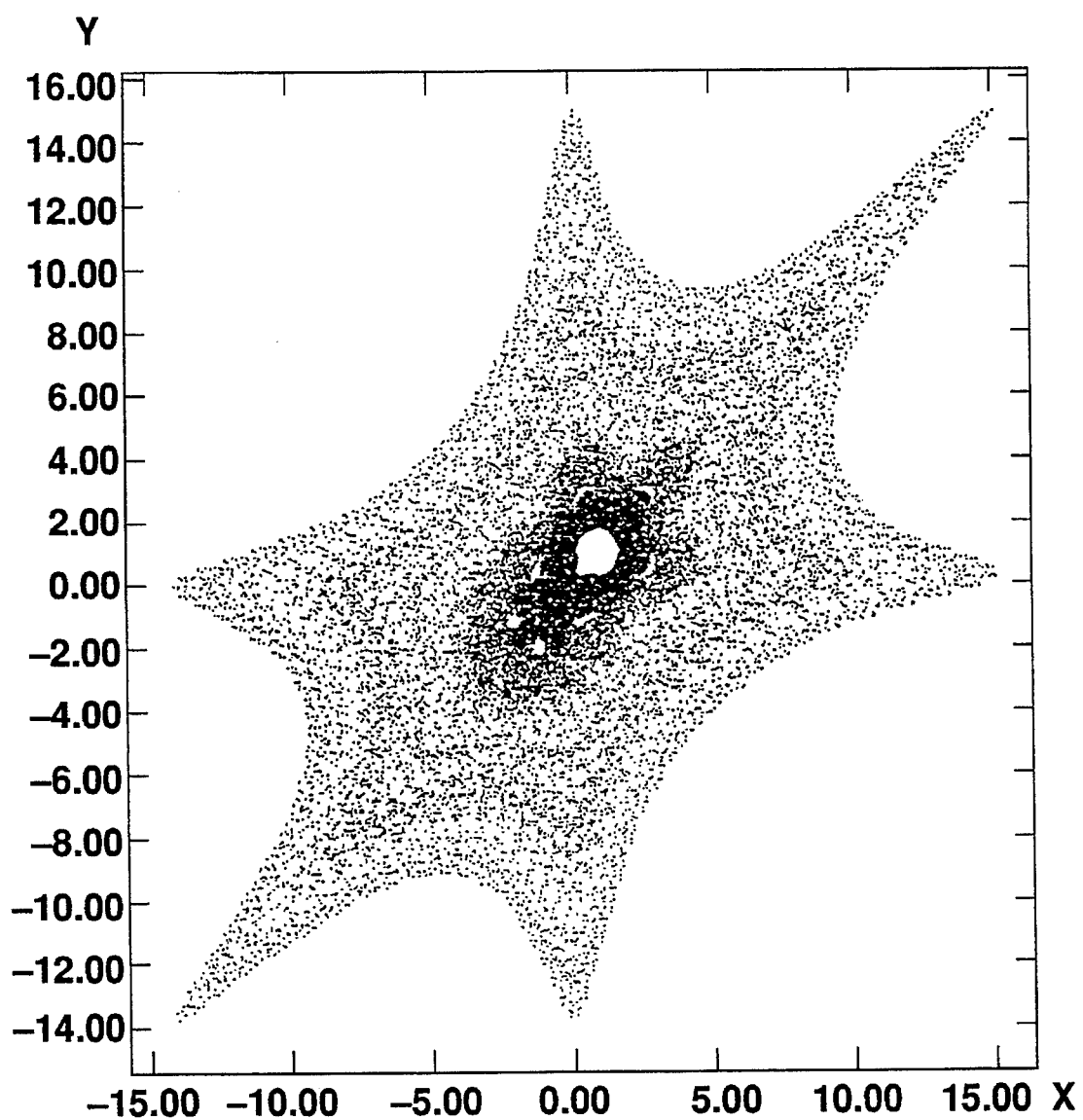
FIG. 34 depicts a still further example of a pattern described by the chaotic signals.

FIG. 34 illustrates a case where one parameter has been further changed into a1=1,000, and the initial values (x0=0.000, y0=0,000) and the other parameter (a2=−1,000) are unchanged. The pattern undergoes a complete transformation.

Conceivable is a variant two-dimensionally displaying such set of points (xn, yn). A display device may, for example, be a CRT display unit, a plasma display, a liquid crystal display, or a device including point sources of light arranged in a matrix manner.

Manners of displaying are as follows.

1) Display of Pattern Formation Process

Points represented by (xn, yn) which will be obtained while incrementing n every fixed interval of time are displayed in sequence. The points which have already been displayed may be deleted or may be left as they are.

This display reveals the state of formation of the pattern with a lapse of time, or a locus of the points.

2) Display of Static Pattern

A set of coordinates representing a predetermined number of (e.g., 20001 as described above) points is in advance found, and all of such points are displayed at one time. The patterns as shown in FIGS. 30 to 34 will appear.

3) Display of Dynamic Pattern

With respect to the display of static pattern shown in 2), n is further incremented to find a new point. The obtained point is additionally displayed whereas the display of the oldest point is deleted. Although the number of the points being presently displayed are always unchanged, its display pattern varies with a lapse of time.

4) To cause at least one of initial values and parameters to be changed.

This method may apply to all of 1) through 3) described above.

With respect to the manner of display stated in 2) in particular, the display pattern is subjected to an abrupt change, for example, from FIG. 30 pattern to FIG. 31 pattern, or from FIG. 32 pattern to FIG. 33 pattern, etc.

Such display will be effective in a background display of advertisement. The above-described change in pattern and locus of the points are quite random and impossible to predict. Nevertheless, without causing any unpleasant feeling, as noise does, it is interesting and attractive to look at.

Although the above description has been made of the case where the dynamics of the system is expressed as difference equations (e.g., Expression 1), the same will apply to the case where it is expressed as differential equations in the form $$dx/dt=f(x)+ay \qquad \text{...Expression 42}$$

$$dy/dt=x \qquad \text{...Expression 43}$$

In this case, the delay element may be replaced with an integral element. In the present invention, the delay element, delay means, and delay circuit involve an integral element, integral means, and integrating circuit, respectively.

What is claimed is:

1. An apparatus for generating chaotic signals, comprising:

a plurality of delay means for delaying input signals in sequence by a predetermined period of time;

a nonlinear function means for converting through a nonlinear function a signal derived from at least one of said delay means;

a coefficient means for multiplying signals derived from at least one of said delay means by a predetermined coefficient:

an adding means for adding signals derived from said nonlinear function means and coefficient means;

an initializing means for conferring initial values on said delay means at the time of initiation of operation; and an output terminal connected to an output of one of: one of said delay means; said nonlinear function means; said coefficient means; said adding means; and said initializing means for supplying an output chaotic signal;

output of said adding means being fed back to a foremost one of said plurality of delay means.

2. An apparatus for generating chaotic signals, comprising:

a plurality of delay means for delaying input signals in sequence by a predetermined period of time;

a nonlinear function means for converting through a nonlinear function a signal derived from at least one of said delay means;

a coefficient means for multiplying signals derived from at least one of said delay means by a predetermined coefficient:

an adding means for adding signals derived from said nonlinear function means and coefficient means;

an initializing means for conferring initial values on said nonlinear function means and said coefficient means at the time of initiation of operation; and an output terminal connected to an output of one of: one of said delay means; said nonlinear function means; said coefficient means; said adding means; and said initializing means for supplying an output chaotic signal;

output of said adding means being fed back to a foremost one of said plurality of delay means.

3. An apparatus for generating chaotic signals, comprising:

a plurality of delay means for delaying input signals in sequence by a predetermined period of time;

a nonlinear function means for converting through a nonlinear function a signal derived from at least one of said delay means;

a coefficient means for multiplying signals derived from at least one of said delay means by a predetermined coefficient:

an adding means for adding signals derived from said nonlinear function means and coefficient means;

an initializing means for conferring initial values on said adding means at the time of initiation of operation; and an output terminal connected to an output of one of: one of said delay means; said nonlinear function means; said coefficient means; said adding means; and said initializing means for supplying an output chaotic signal;

output of said adding means being fed back to a foremost one of said plurality of delay means.

4. A chaos device comprising:

a plurality of delay circuits for delaying input signals in sequence by an infinitesimal period of time;

a nonlinear function circuit for converting through a nonlinear function a signal derived from at least one of said delay circuits;

a coefficient circuit for multiplying signals derived from at least one of said delay circuits by a predetermined coefficient;

an adding circuit for adding signals derived from said nonlinear function circuit and said coefficient circuit;

an initializing circuit for conferring initial values on said delay circuits at the time of initiation of operation; and an output terminal connected to an output of one of: one of said delay circuits; said nonlinear function circuit; said coefficient circuit; said adding circuit; and said initializing circuit for supplying an output chaotic signal;

output of said adding circuit being fed back to a foremost one of said plurality of delay circuits.

5. A chaos device comprising:

a plurality of delay circuits for delaying input signals in sequence by an infinitesimal period of time;

a nonlinear function circuit for converting through a nonlinear function a signal derived from at least one of said delay circuits;

a coefficient circuit for multiplying signals derived from at least one of said delay circuits by a predetermined coefficient;

an adding circuit for adding signals derived from said nonlinear function circuit and said coefficient circuit;

an initializing circuit for conferring initial values on said nonlinear function circuit and said coefficient circuit at the time of initiation of operation; and an output terminal connected to an output of one of: one of said delay circuits; said nonlinear function circuit; said coefficient circuit; said adding circuit; and said initializing circuit for supplying an output chaotic signal;

output of said adding circuit being fed back to a foremost one of said plurality of delay circuits.

6. A chaos device comprising:

a plurality of delay circuits for delaying input signals in sequence by an infinitesimal period of time;

a nonlinear function circuit for converting through a nonlinear function a signal derived from at least one of said delay circuits;

a coefficient circuit for multiplying signals derived from at least one of said delay circuits by a predetermined coefficient;

an adding circuit for adding signals derived from said nonlinear function circuit and said coefficient circuit;

an initializing circuit for conferring initial values on said adding circuit at the time of initiation of operation; and an output terminal connected to an output of one of: one of said delay circuits; said nonlinear function circuit; said coefficient circuit; said adding circuit; and said initializing circuit for supplying an output chaotic signal;

output of said adding circuit being fed back to a foremost one of said plurality of delay circuits.

7. An apparatus for generating chaotic signals, comprising:

a plurality of delay means for delaying input signals in sequence by a predetermined period of time;

a plurality of nonlinear function means for converting signals derived from at least one of said delay means through their respective nonlinear functions;

an adding means for adding signals derived from said plurality of nonlinear function means;

an initializing means for conferring initial values on said delay means at the time of initiation of operation; and an output terminal connected to an output of one of: one of said delay means; one of said nonlinear function means; said adding means; and said initializing means for supplying an output chaotic signal;

output of said adding means being fed back to a foremost one of said plurality of delay means.

8. An apparatus for generating chaotic signals, comprising:

a plurality of delay means for delaying input signals in sequence by a predetermined period of time;

a plurality of nonlinear function means for converting signals derived from at least one of said delay means through their respective nonlinear functions;

an adding means for adding signals derived from said plurality of nonlinear function means;

an initializing means for conferring initial values on said nonlinear function means at the time of initiation of operation; and an output terminal connected to an output of one of: one of said delay means; one of said nonlinear function means; said adding means; and said initializing means for supplying an output chaotic signal;

output of said adding means being fed back to a foremost one of said plurality of delay means.

9. A chaos device comprising:

a plurality of delay circuits for delaying input signals in sequence by an infinitesimal period of time;

a plurality of nonlinear function circuits for converting signals derived from said delay circuits through their respective predetermined nonlinear functions;

an adding circuit for adding signals derived from said plurality of nonlinear function circuits;

an initializing circuit for conferring initial values on said delay circuits at the time of initiation of operation; and an output terminal connected to an output of one of: one of said delay circuits; one of said nonlinear function circuits; said adding circuit; and said initializing circuit for supplying an output chaotic signal;

output of said adding circuit being fed back to a foremost one of said plurality of delay circuits.

10. A chaos device comprising:

a plurality of delay circuits for delaying input signals in sequence by an infinitesimal period of time;

a plurality of nonlinear function circuits for converting signals derived from said delay circuits through their respective predetermined nonlinear functions;

an adding circuit for adding signals derived from said plurality of nonlinear function circuits;

an initializing circuit for conferring initial values on said nonlinear function circuits at the time of initiation of operation; and an output terminal connected to an output of one of: one of said delay circuits; one of said nonlinear function circuits; said adding circuit; and said initializing circuit for supplying an output chaotic signal;

output of said adding circuit being fed back to a foremost one of said plurality of delay circuits.

* * * * *